United States Patent
Shintate et al.

(10) Patent No.: US 7,767,252 B2
(45) Date of Patent: Aug. 3, 2010

(54) MULTILAYER STRUCTURE FORMING METHOD, METHOD OF MANUFACTURING WIRING BOARD, AND METHOD MANUFACTURING OF ELECTRONIC APPARATUS

(75) Inventors: Tsuyoshi Shintate, Matsuyama-machi (JP); Kazuaki Sakurada, Suwa (JP); Jun Yamada, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 761 days.

(21) Appl. No.: 11/222,851

(22) Filed: Sep. 12, 2005

(65) Prior Publication Data

US 2006/0068573 A1    Mar. 30, 2006

(30) Foreign Application Priority Data

Sep. 27, 2004   (JP)   ............................. 2004-278981
Oct. 12, 2004   (JP)   ............................. 2004-297213
Jul. 29, 2005   (JP)   ............................. 2005-220146

(51) Int. Cl.
   *H01L 21/20*   (2006.01)
(52) U.S. Cl. ....................................... 427/58
(58) Field of Classification Search ................ 428/901; 438/620; 427/68, 66; 313/504
   See application file for complete search history.

(56) References Cited

U.S. PATENT DOCUMENTS 7,250,377 B2 *   7/2007   Shintate et al.   ............. 438/778

2003/0213614 A1 *   11/2003   Furusawa et al.   ........... 174/256
2004/0145858 A1      7/2004   Sakurada
2005/0026419 A1 *    2/2005   Yudasaka et al.   ............ 438/620

FOREIGN PATENT DOCUMENTS

| JP | A-2-39597    | 2/1990  |
| JP | A-11-67799   | 3/1999  |
| JP | A-2000-158639| 6/2000  |
| JP | 02001051269  | * 2/2001|
| JP | A-2003-311196| 11/2003 |
| JP | A 2004-006578| 1/2004  |
| JP | A-2004-186668| 7/2004  |

\* cited by examiner

*Primary Examiner*—Michael Cleveland
*Assistant Examiner*—Tabassom Tadayyon Eslami
(74) *Attorney, Agent, or Firm*—Oliff & Berridge, PLC

(57) ABSTRACT

A droplet discharge apparatus is used in a multilayer structure forming method of the invention. The multilayer structure forming method includes: discharging droplets of a first conductive material to form a first conductive material pattern on a surface of an object; baking the first conductive material pattern to form a wiring pattern; discharging droplets of a first insulating material including a first photo-curable material to form a first insulating material pattern bordering via holes on the wiring pattern; curing the first insulating material pattern to form a first insulating pattern bordering the via holes; making the surface of the object lyophilic; discharging droplets of a second insulating material including a second photo-curable material to form a second insulating material pattern that covers the wiring pattern and the surface of the object which has been made lyophilic, and surrounds the first insulating pattern; and curing the second insulating material pattern to form a second insulating pattern that surrounds the first insulating pattern. In addition, preferably, the first conductive material includes silver (Ag) nanoparticles.

12 Claims, 15 Drawing Sheets

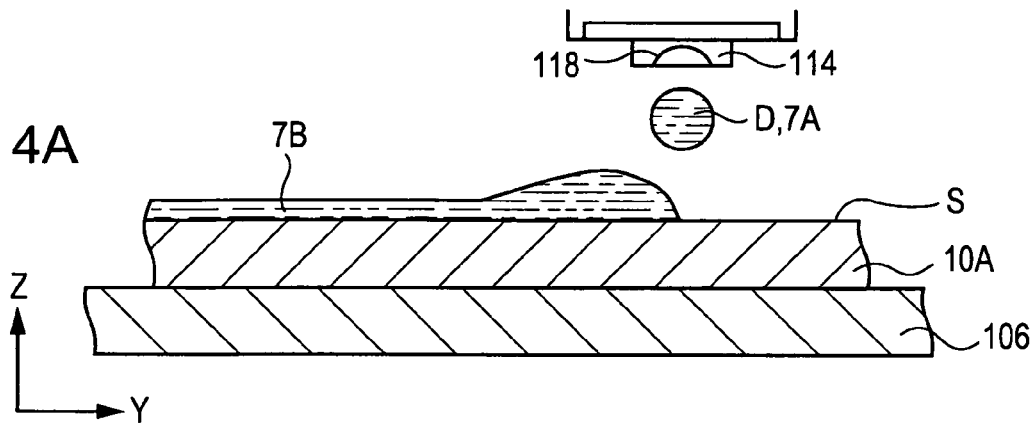
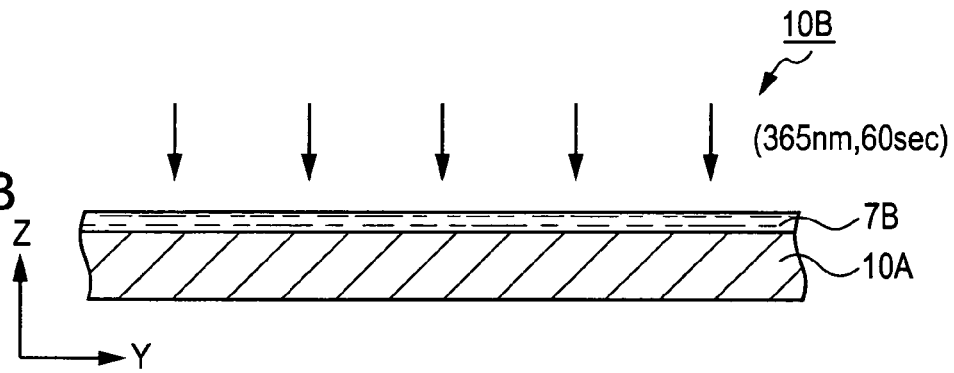
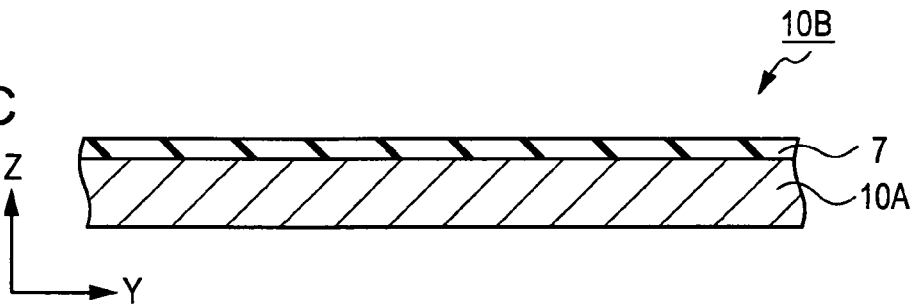
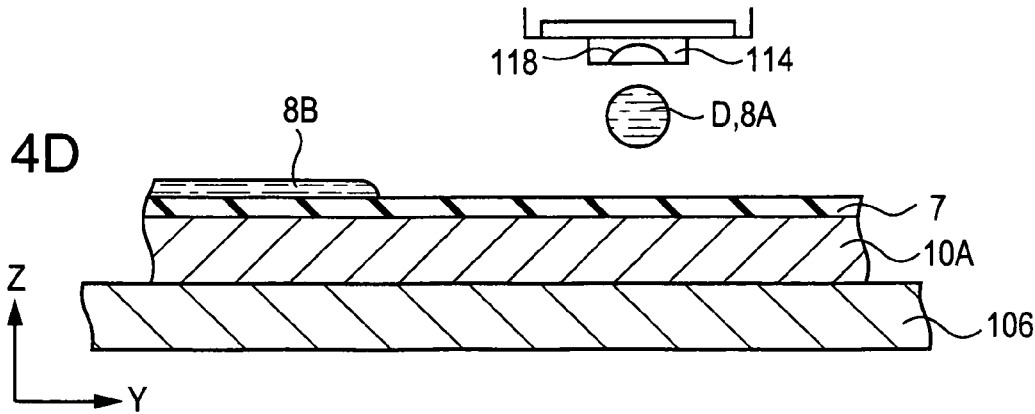

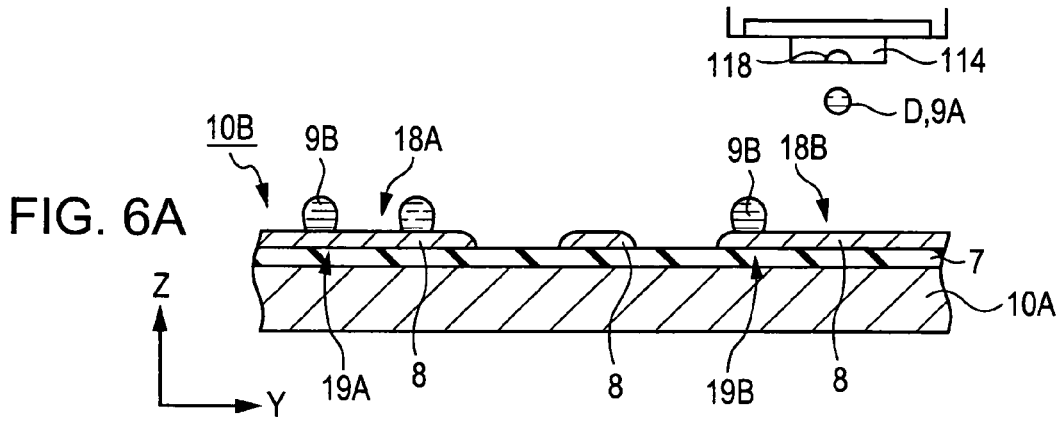
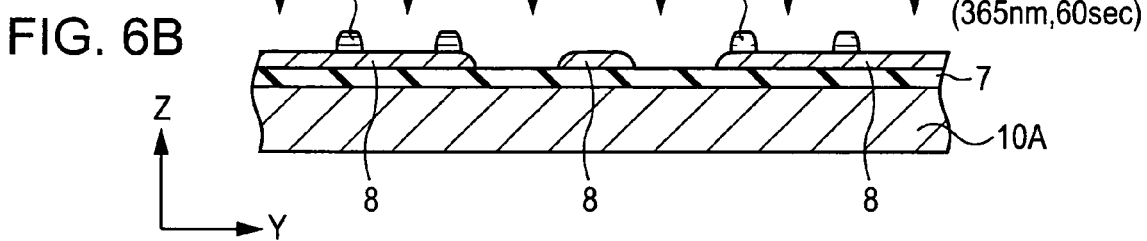
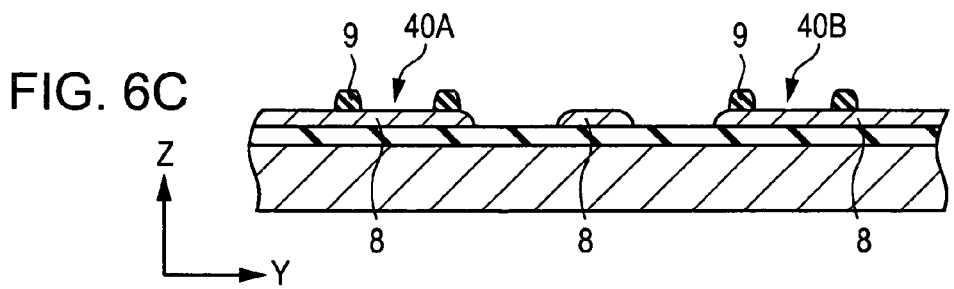
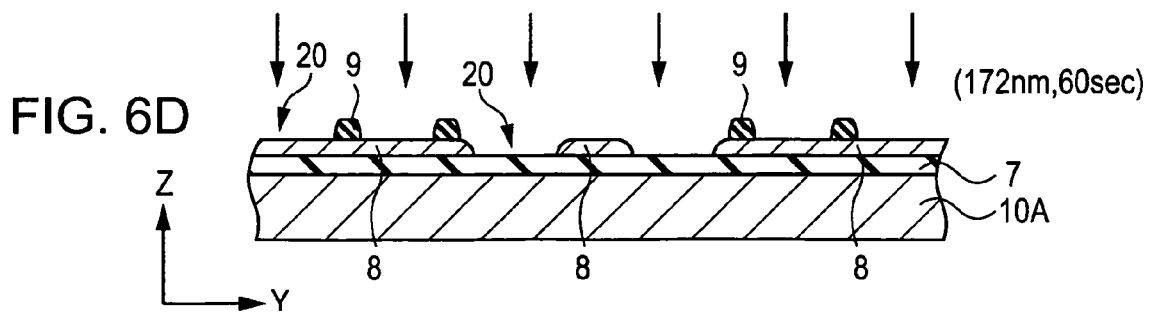

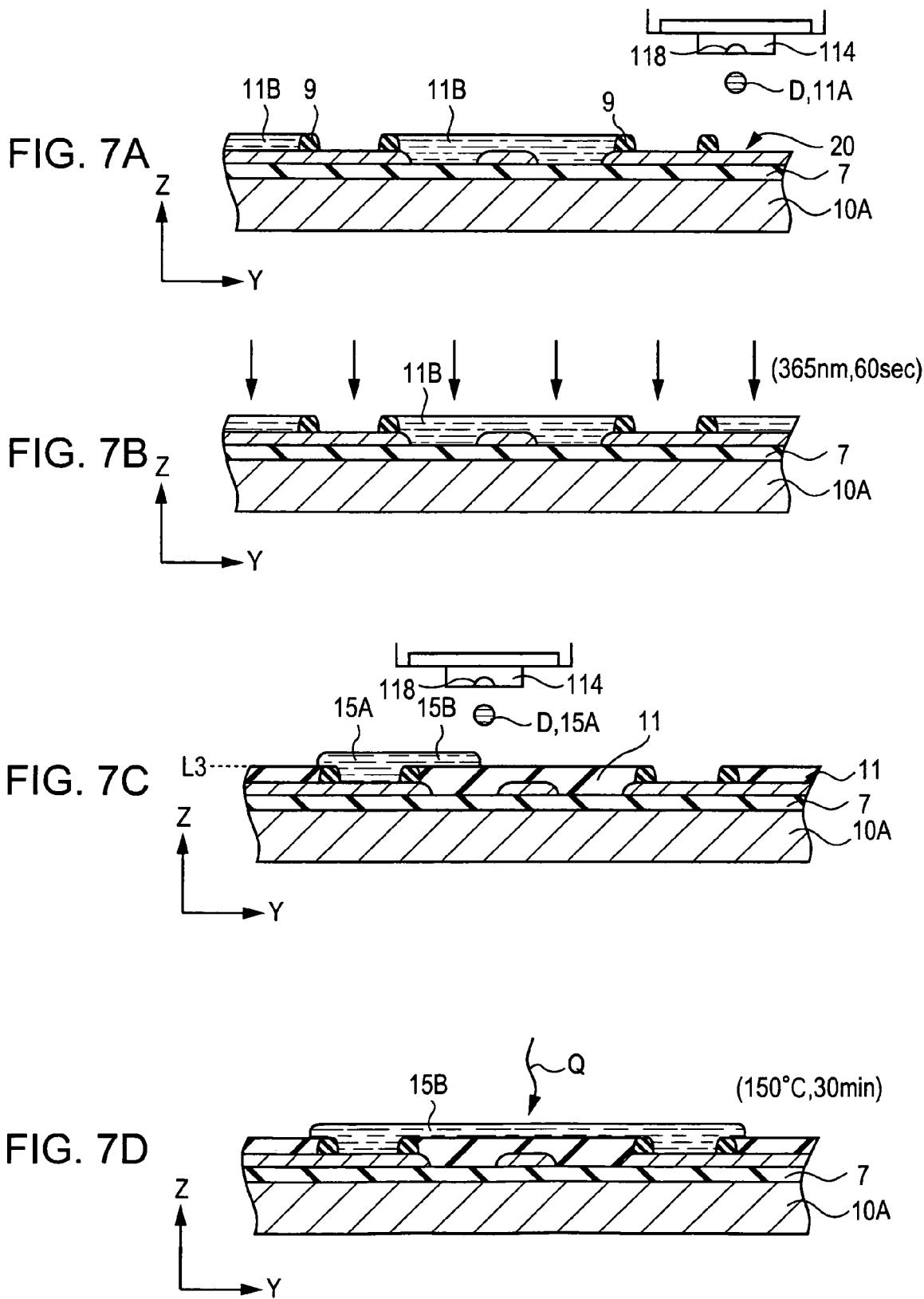

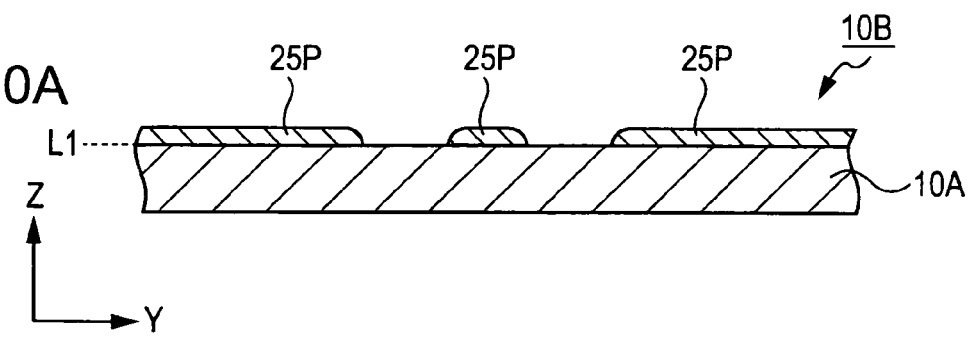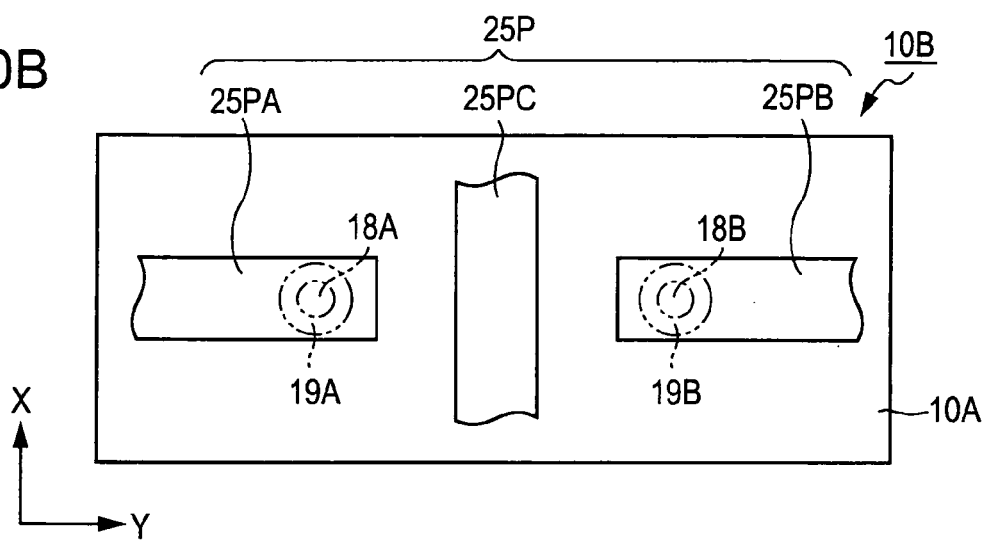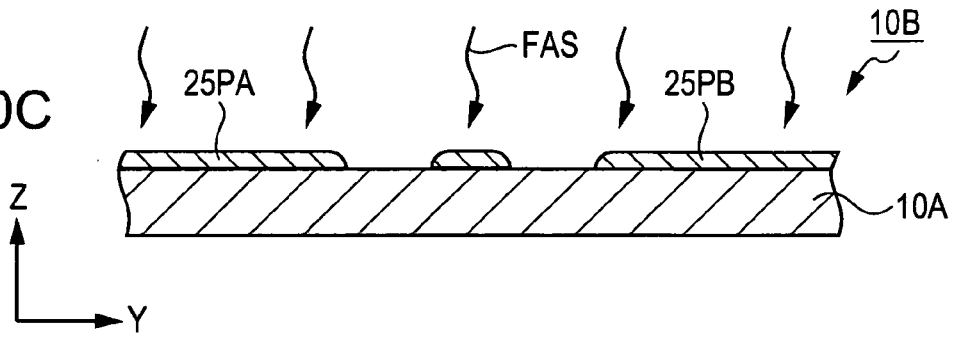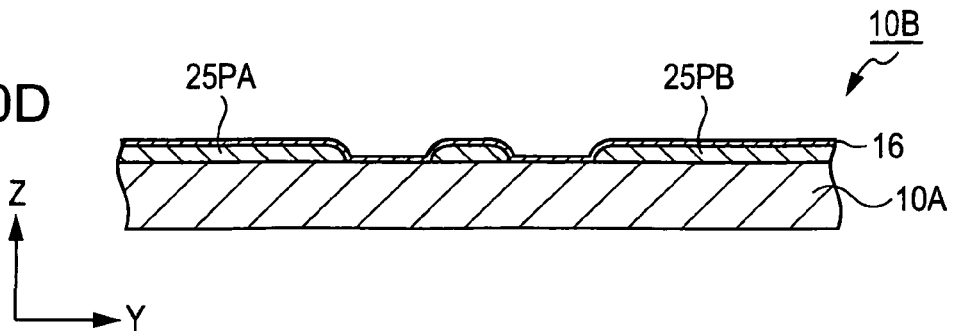

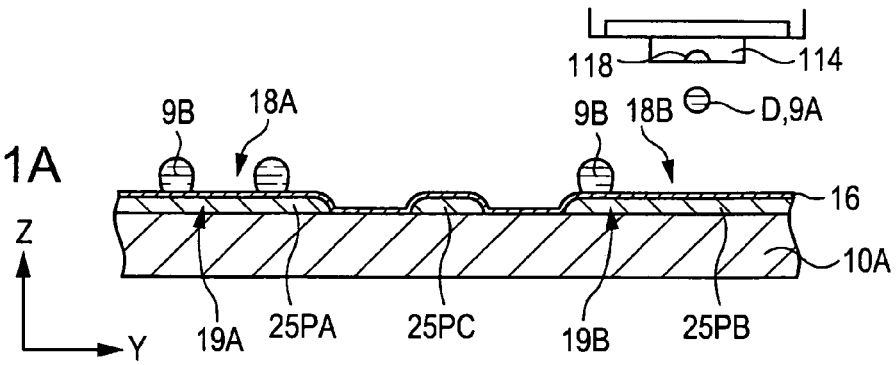
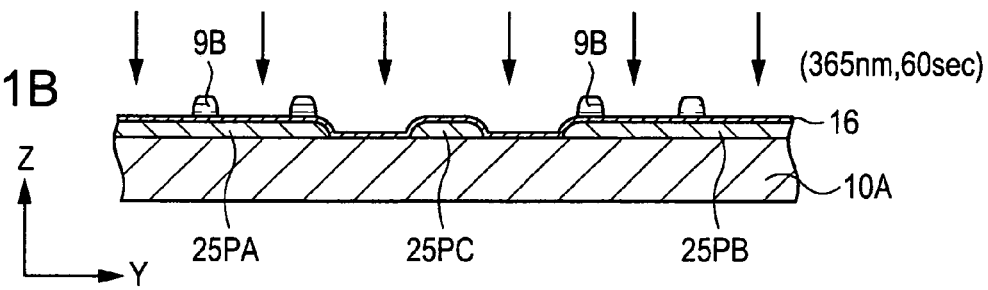
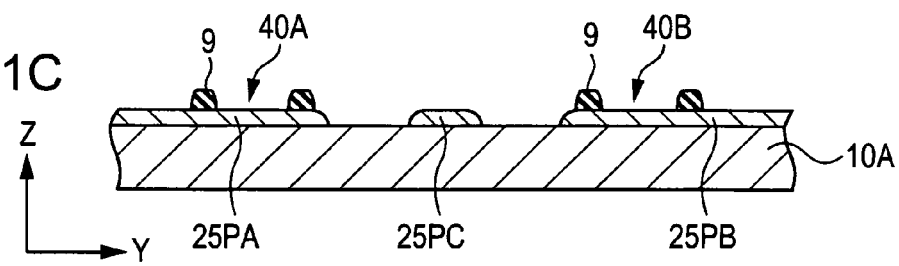
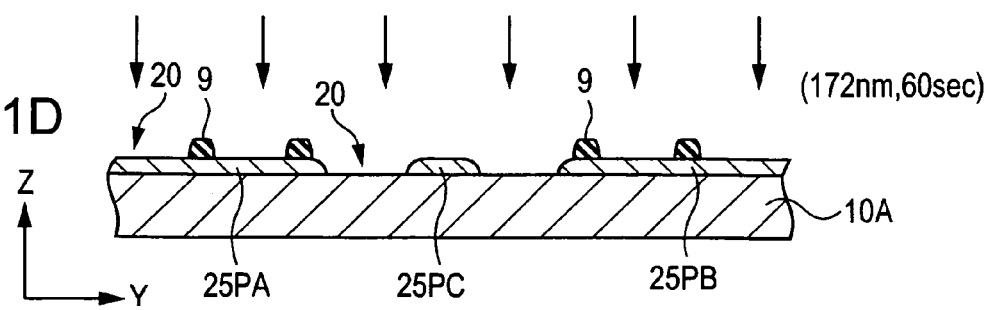

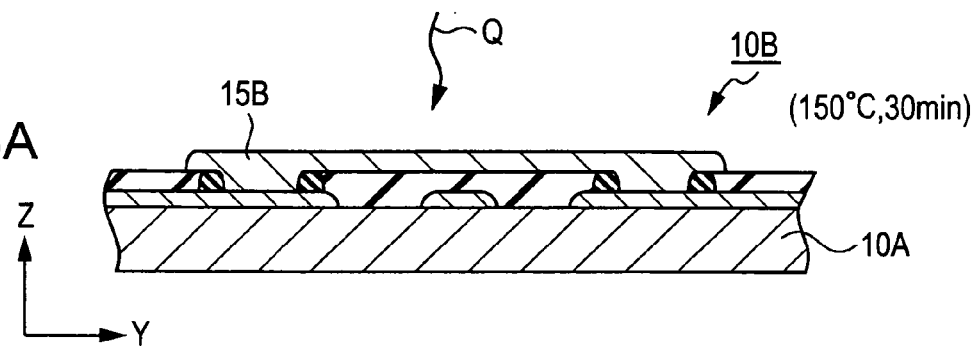
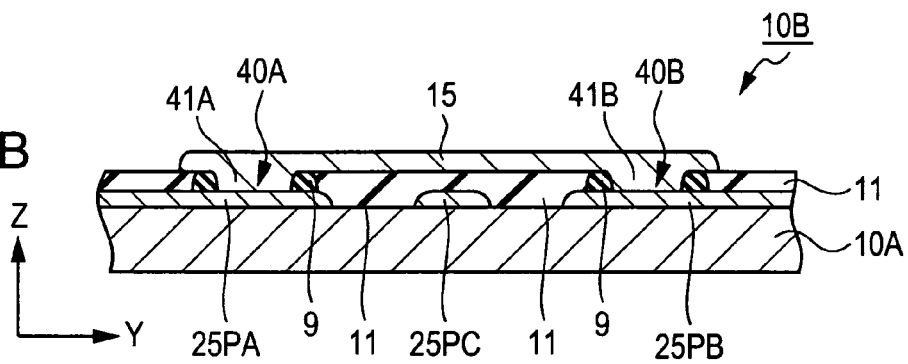
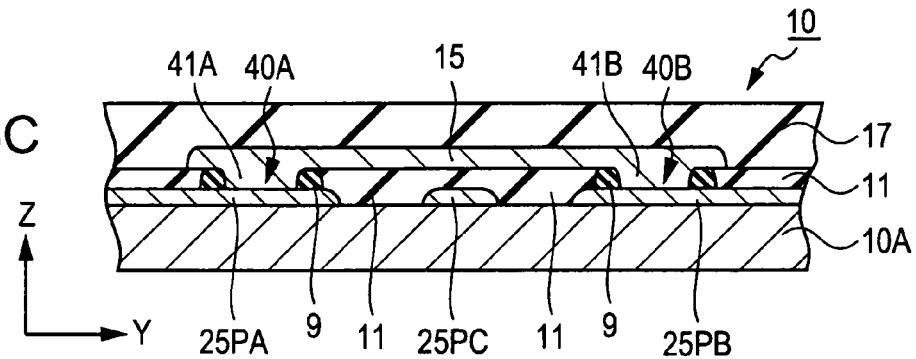

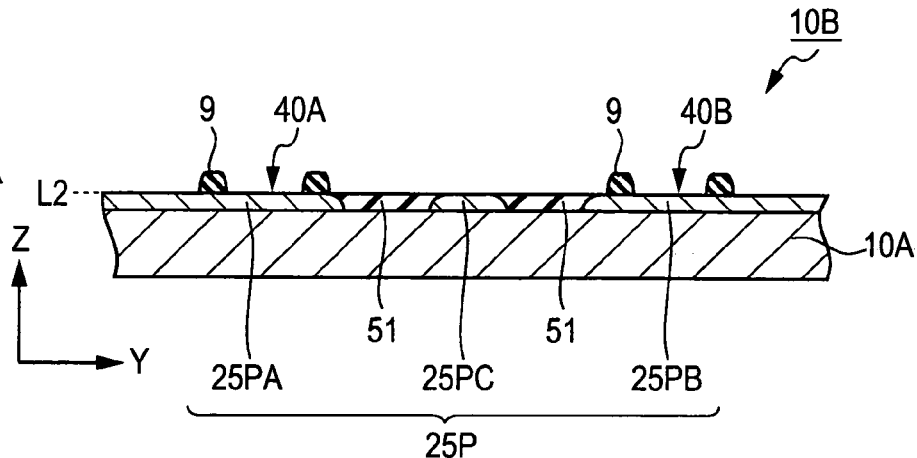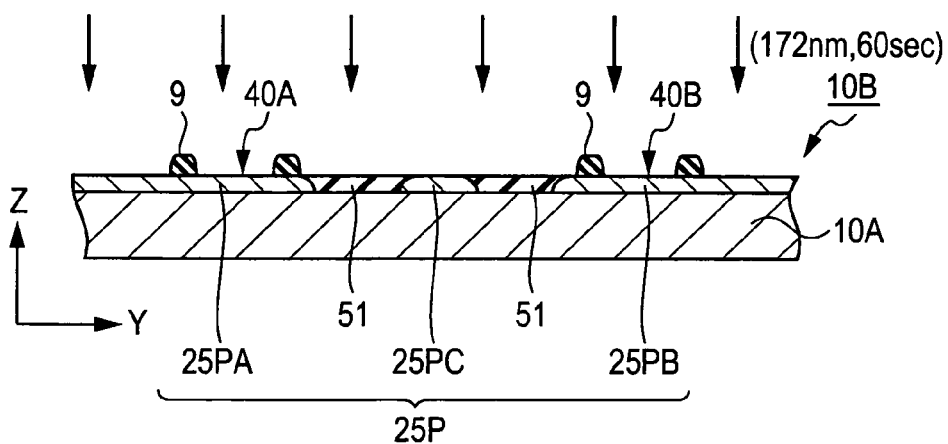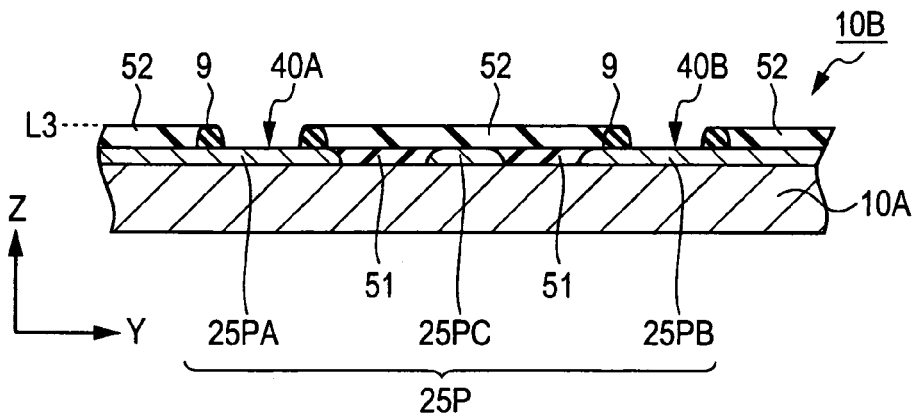

MULTILAYER STRUCTURE FORMING METHOD, METHOD OF MANUFACTURING WIRING BOARD, AND METHOD MANUFACTURING OF ELECTRONIC APPARATUS

This application claims the benefit of Japanese Patent Application No. 2004-278981, filed Sep. 27, 2004; Japanese Patent Application No. 2004-297213, filed Oct. 12, 2004; and Japanese Patent Application No. 2005-220146, filed Jul. 29, 2005. The entire disclosure of the prior applications are hereby incorporated by reference herein in their entirety.

BACKGROUND

1. Technical Field

The present invention relates to a multilayer structure forming method using a droplet discharge apparatus, and in particular, to a multilayer structure forming method which is suitable for manufacturing of a wiring board and manufacturing of an electronic apparatus.

2. Related Art

In recent years, attention has been paid to a method of manufacturing wiring boards or circuit boards using an additive process by a printing method. This is because the cost of the additive process is low as compared with a method of manufacturing wiring boards or circuit boards by repeatedly carrying out a process of coating a thin film and a photolithographic process.

As one of the techniques that are utilized in such an additive process, a technique of forming conductive patterns using an inkjet method has been known (for example, JP-A-2004-6578).

When a wiring pattern is formed by the inkjet method, a pattern of a conductive material disposed by a droplet discharge apparatus is baked to obtain a wiring pattern. The surface of the wiring pattern formed by baking has a lyophobic property against a liquid insulating material, such as acrylic resin. Therefore, it is not difficult to draw insulating patterns defining the outer shape of via holes on such a wiring pattern, by the inkjet method.

However, the baking at the time of baking the wiring pattern causes surfaces even other than the wiring pattern to exhibit a lyophobic property. Specifically, the baking makes the surface of an insulating layer, which is exposed at another portion than the wiring pattern, lyophobic. Therefore, it is difficult to laminate insulating layers with uniform thickness in other portions than the vicinities of via holes by the inkjet method.

Further, when an insulating layer having via holes or contact holes is formed by the inkjet method, it is required to use a liquid material having a relatively high concentration. This is because the time required until the liquid material having a relatively high concentration loses its fluidity due to vaporization of a solvent after being discharged is so short that the outer shape of openings becoming the via holes can be easily shaped.

However, the area that such a liquid material spreads on a surface of an object after landing is small. Therefore, such a liquid material is suitable for forming portions bordering via holes in an insulating layer, but it causes difficulties in forming portions away from the via holes.

SUMMARY

An advantage of some aspects of the invention is that it provides a multilayer structure forming method using a droplet discharge apparatus.

According to an aspect of the invention, a droplet discharge apparatus is used in a multilayer structure forming method of the invention. The multilayer structure forming method includes: (A) discharging droplets of a first conductive material to form a first conductive material pattern on a surface of an object; (B) baking the first conductive material pattern to form a wiring pattern; (C) discharging droplets of a first insulating material including a first photo-curable material to form a first insulating material pattern bordering via holes on the wiring pattern; (D) curing the first insulating material pattern to form a first insulating pattern bordering the via holes; (E) making the surface of the object lyophilic; (F) discharging droplets of a second insulating material including a second photo-curable material to form a second insulating material pattern that covers the wiring pattern and the surface of the object which has been made lyophilic, and surrounds the first insulating pattern; and (G) curing the second insulating material pattern to form a second insulating pattern that surrounds the first insulating pattern. In addition, preferably, the first conductive material includes silver (Ag) nanoparticles.

One of the effects that can be obtained by the above configuration is that a multilayer structure having via holes can be formed using a droplet discharge apparatus.

Preferably, the multilayer structure forming method further includes (H) discharging droplets of a second conductive material into the via holes to fill the via holes with the second conductive material; and (I) sintering the second conductive material filled in the via holes to form conductive posts.

According to the above configuration, a multilayer structure having conductive posts can be formed using a droplet discharge apparatus.

According to another aspect of the invention, a method of manufacturing a wiring board includes the above multilayer structure forming method. Further, according to still another aspect of the invention, a method of manufacturing an electronic apparatus includes the multilayer structure forming method. By these methods, wiring boards or electronic apparatuses can be manufactured using a droplet discharge apparatus.

According to still another aspect of the invention, a droplet discharge apparatus is used in a multilayer structure forming method. The multilayer structure forming method includes: (A) making a surface of a wiring pattern located on a surface of an object lyophobic; (B) discharging droplets of a first insulating material including a first photo-curable material onto the surface of the wiring pattern, which has been made lyophobic, to form a first insulating material pattern bordering via holes on the wiring pattern; (C) curing the first insulating material pattern to form a first insulating pattern bordering the via holes; (D) making the surface of the object lyophilic; (E) discharging droplets of a second insulating material including a second photo-curable material to form a second insulating material pattern that covers the wiring pattern and the surface of the object which has been made lyophilic, and surrounds the first insulating pattern; and (F) curing the second insulating material pattern.

One of the effects that can be obtained by the above features is that since the degree that a liquid material (the insulating material) spreads on the surface of an object changes even if the viscosity of the liquid material is not adjusted, a droplet discharge apparatus can be used to form insulating layers (the first insulating material pattern and the second insulating material pattern which have been cured) having via holes.

Preferably, the multilayer structure forming method further includes: (G) discharging droplets of a liquid conductive material to fill the via holes with the conductive material; and (H) sintering the conductive material filled in the via holes to form conductive posts.

According to the above feature, a droplet discharge apparatus can be used to provide conductive posts in the via holes.

More preferably, the conductive material includes silver (Ag).

According to the above feature, it becomes easy to form conductive posts by using a droplet discharge apparatus.

The invention can be implemented in various aspects other than the multilayer structure forming method. For example, the invention can be implemented as a method of manufacturing a wiring board, and can be implemented as a method of manufacturing an electronic apparatus.

BRIEF DESCRIPTION OF THE DRAWINGS

The invention will be described with reference to the accompanying drawings, wherein like numbers reference like elements.

FIGS. 4A to 4D illustrate a method of manufacturing a wiring board according to a first embodiment.

FIGS. 6A to 6D illustrate the method of manufacturing a wiring board according to the first embodiment.

FIGS. 7A to 7D illustrate the method of manufacturing a wiring board according to the first embodiment.

FIGS. 10A to 10D illustrate a method of manufacturing a wiring board according to a third embodiment.

FIGS. 11A to 11D illustrate the method of manufacturing a wiring board according to the third embodiment.

FIGS. 13A to 13C illustrate the method of manufacturing a wiring board according to the third embodiment.

FIGS. 14A to 14C illustrate a method of manufacturing a wiring board according to a fourth embodiment.

DESCRIPTION OF EXEMPLARY EMBODIMENTS

First Embodiment

Overall Construction of Droplet Discharge Apparatus

Figure 1:
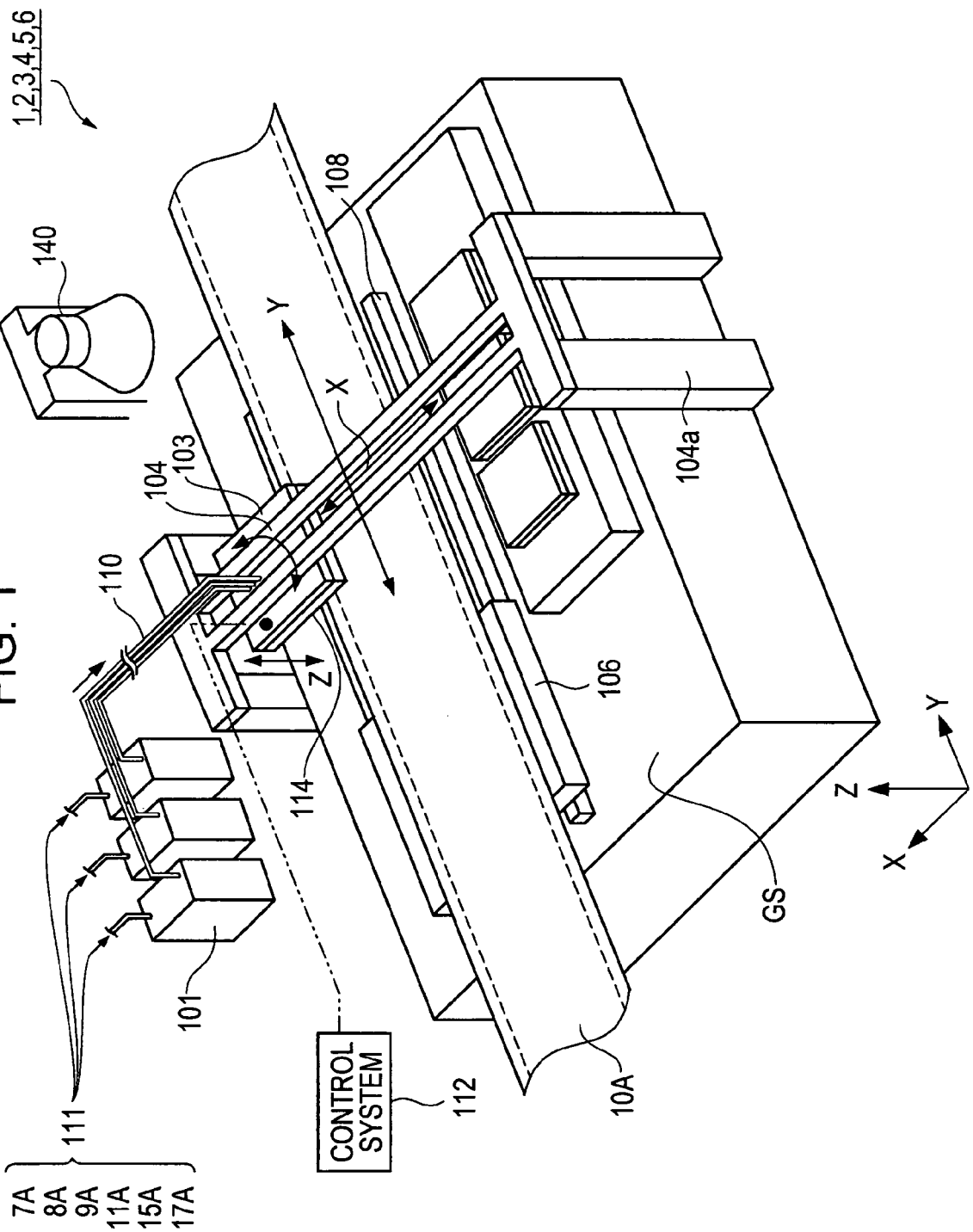
FIG. 1 is a schematic view showing a droplet discharge apparatus according to a first to fourth embodiments.

A multilayer structure forming method of the present embodiment utilizes droplet discharge apparatuses 1 to 6 of FIG. 1. The droplet discharge apparatuses 1 to 6 are apparatuses which discharge an insulating material 7A (FIG. 1), a conductive material 8A, an insulating material 9A, an insulating material 11A, a conductive material 15A, and an insulating material 17A, respectively. In addition, all of the insulating material 7A, the conductive material 8A, the insulating materials 9A, the insulating material 11A, the conductive material 15A, and the insulator 17A are a kind of material liquid as will be described below.

The droplet discharge apparatus 1 shown in FIG. 1 is basically an inkjet apparatus. More specifically, the droplet discharge apparatus 1 includes a tank 101 that holds a liquid material 111, a tube 110, a ground stage GS, a discharge head unit 103, a stage 106, a first position control unit 104, a second position control unit 108, a control system 112, a light irradiation unit 140, and a support member 104a. In addition, the structure and functions of the other five droplet discharge apparatuses 2 to 6 are basically the same as the structure and functions of the droplet discharge apparatus 1, and therefore, description of the structure and functions of the five droplet discharge apparatuses 2 to 6 will be omitted.

The discharge head unit 103 holds a head 114 (FIG. 2). The head 114 discharges droplets of the liquid material 111 in response to signals from the control unit 112. In addition, the head 114 of the discharge head unit 103 is coupled to the tank 101 by the tube 110. For this reason, the liquid material 111 is supplied from the tank 101 to the head 114.

The stage 106 provides a flat surface for fixing the substrate 10A. The stage 106 also serves to fix the position of the substrate 10A using suction power. Here, the substrate 10A is a flexible substrate made of polyimide, and has a tapered shape. Both ends of the substrate 10A are fixed to a pair of reels (not shown).

The first position control unit 104 is fixed to a position of a predetermined height from the ground stage GS by means of the support member 104a. The first position control unit 104 functions to move the discharge head unit 103 in the X-axis direction and in the Z-axis direction orthogonal to the X-axis direction, in response to signals from the control system 112. The first position control unit 104 also serves to rotate the discharge head unit 103 around an axis parallel to the Z-axis. In this case, in the present embodiment, the Z-axis direction is a direction parallel to a vertical direction (i.e., a direction of gravitational acceleration).

The second position control unit 108 moves the stage 106 in the Y-axis direction on the ground stage GS in response to signals from the control system 112. In this case, the Y-axis direction is a direction orthogonal to both the X-axis direction and the Z-axis direction.

The construction of the first position control unit 104 having the above functions and the construction of the second position control unit 108 having the above functions can be implemented using a known XY robot using a linear motor or a servo motor. Thus, the detailed description thereof will be omitted herein. In addition, in the present specification, the first position control unit 104 and the second position control unit 108 will also be referred to as a "robot" or "scanning unit".

As described above, the discharge head unit 103 moves in the X-axis direction by means of the first position control unit 104. Further, the substrate 10A moves in the Y-axis direction together with the stage 106 by means of the second position control unit 108. As a result, the position of the head 114 relative to the substrate 10A changes. More specifically, this operation causes the discharge head unit 103, the head 114 or the nozzles 118 (FIG. 2) to relatively move in the X-axis direction and the Y-axis direction, i.e., perform scanning in a relative way, while maintaining a predetermined distance from the substrate 10A in the Z-axis direction. The term "relative moving" or "relative scanning" means that one of a first side where the liquid material 111 is discharged and a second side (a target discharge portion) in which a discharged material lands from the first side moves relative to the other.

The control system 112 is configured to receive discharge data indicating relative positions where droplets of the liquid material 111 are to be discharged, from an external information processing unit. The control system 112 stores the received discharge data in a storage unit, and controls the first position control unit 104, the second position control unit 108 and the head 114 according to the stored discharge data. In addition, the discharge data is data for applying the liquid material 111 onto the substrate 10A in a predetermined pattern. In the present embodiment, the discharge data has a format of bit map data.

The droplet discharge apparatus 1 having the above construction moves a nozzle 118 (FIG. 2) of the head 114 relative to the substrate 10A according to the discharge data, and discharges the liquid material 111 from the nozzle 118 toward the target discharge portion. In addition, the relative movement of the head 114 by the droplet discharge apparatus 1 and the discharge of the liquid material 111 from head 114 may be referred to as "coating scanning" or "discharge scanning", collectively.

In the present specification, a portion where droplets of the liquid material 111 land is also referred to "target discharge portion". Further, a portion that gets wet where the landed droplets spread will be referred to as a "target coating portion". Both the "target discharge portion" and the "target coating portion" are portions which are formed by performing a surface reforming treatment on an underlying object so that the liquid material has a desired contact angle. However, even if the surface reforming treatment is not performed, a surface of an underlying object has a desired lyophobic property or a lyophilic property (i.e., the landed liquid material has a preferred contact angle on the surface of the underlying object) to the liquid material, the surface itself of the underlying object may be the "target discharge portion" or the "target coating portion". In addition, in the present specification, the "target discharge portion" will also be referred to as a "target" or "receiving portion".

Now, referring back to FIG. 1, the light irradiation unit 140 is a device which irradiates the liquid material 111 applied to the substrate 10A with ultraviolet light. ON or OFF of the irradiation of ultraviolet light from the light irradiation unit 140 is also controlled by means of the control system 112.

In addition, forming layers, films or patterns by an inkjet method means forming layers, films or patterns on a certain object using an apparatus like the droplet discharge apparatus 1.

Head

Figure 2A:
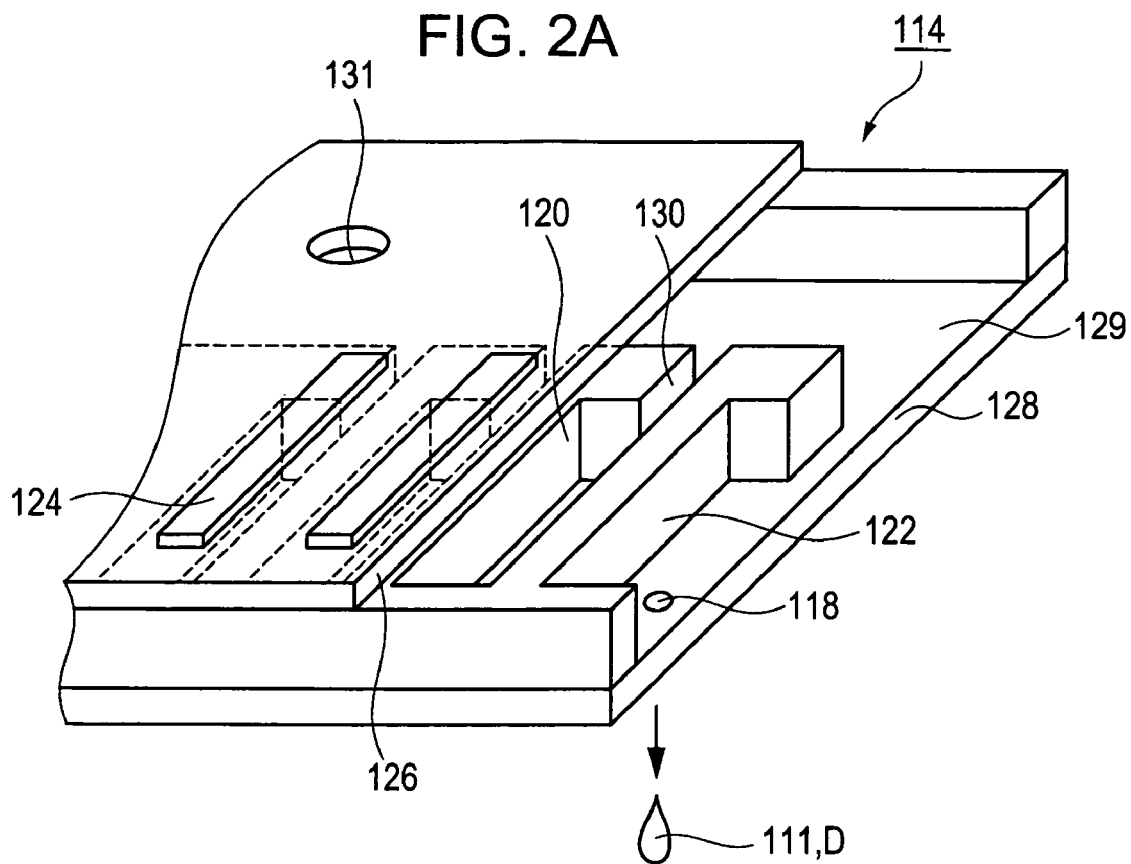
FIGS. 2A and 2B are schematic views showing a head in the droplet discharge apparatus.
Figure 2B:
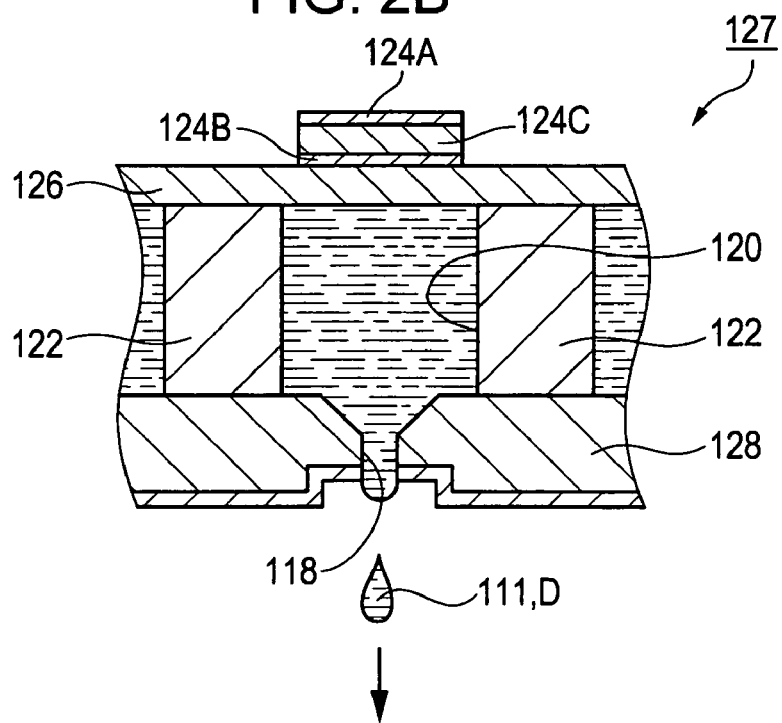

As shown in FIGS. 2A and 2B, the head 114 in the droplet discharge apparatus 1 is an inkjet head having a plurality of nozzles 118. Specifically, the head 114 includes a diaphragm 126, a liquid reservoir 129, a plurality of partition walls 122, a plurality of cavities 120, a plurality of vibrators 124, a nozzle plate 128 defining openings of a plurality of nozzles 118, and supply ports 130, and a hole 131. The liquid reservoir 129 is located between the diaphragm 126 and the nozzle plate 128, and the liquid reservoir 129 is always filled with the liquid material 111 supplied from an external tank (not shown) through the hole 131.

Further, the plurality of partition walls 122 are located between the diaphragm 126 and the nozzle plate 128. Also, a portion surrounded by the diaphragm 126, the nozzle plate 128, and a pair of partition walls 122 is a cavity 120. Since the cavity 120 is formed corresponding to each of the nozzles 118, the number of cavities 120 is the same as the number of nozzles 118. The cavity 120 is supplied with the liquid material 111 from the liquid reservoir 129 through a supply port 130 located between a pair of partition walls 122. In addition, in the present embodiment, the diameter of the nozzle 118 is about 27 μm.

Further, the vibrators 124 are located on the diaphragm 126 corresponding to the cavities 120. Each of the vibrators 124 includes a piezoelectric element 124C, and a pair of electrodes 124A and 124B which sandwiches the piezoelectric element 124C therebetween. The control system 112 applies a drive voltage between the pair of electrodes 124A and 124B whereby a droplet D of the liquid material 111 is discharged from a corresponding nozzle 118. In this case, the volume of the material discharged from the nozzle 118 is variable between 0 pl and 42 pl (pico liter). In addition, the shape of the nozzle 118 is adjusted so that the droplet D of the liquid material 111 can be discharged from the nozzle 118 in the Z-axis direction.

In the present specification, a portion including one nozzle 118, the cavity 120 corresponding to the nozzle 118, and the vibrator 124 corresponding to the cavity 120 will also be referred to as a "discharge unit 127". According to this notation, one head 114 has the discharge units 127 whose number is the same as that of the nozzles 118. The discharge unit 127 may have an electrothermal conversion element instead of the piezoelectric element. In other words, the discharge unit 127 may be constructed to discharge a material using thermal expansion of the material by the electrothermal conversion element.

Control System

Figure 3:
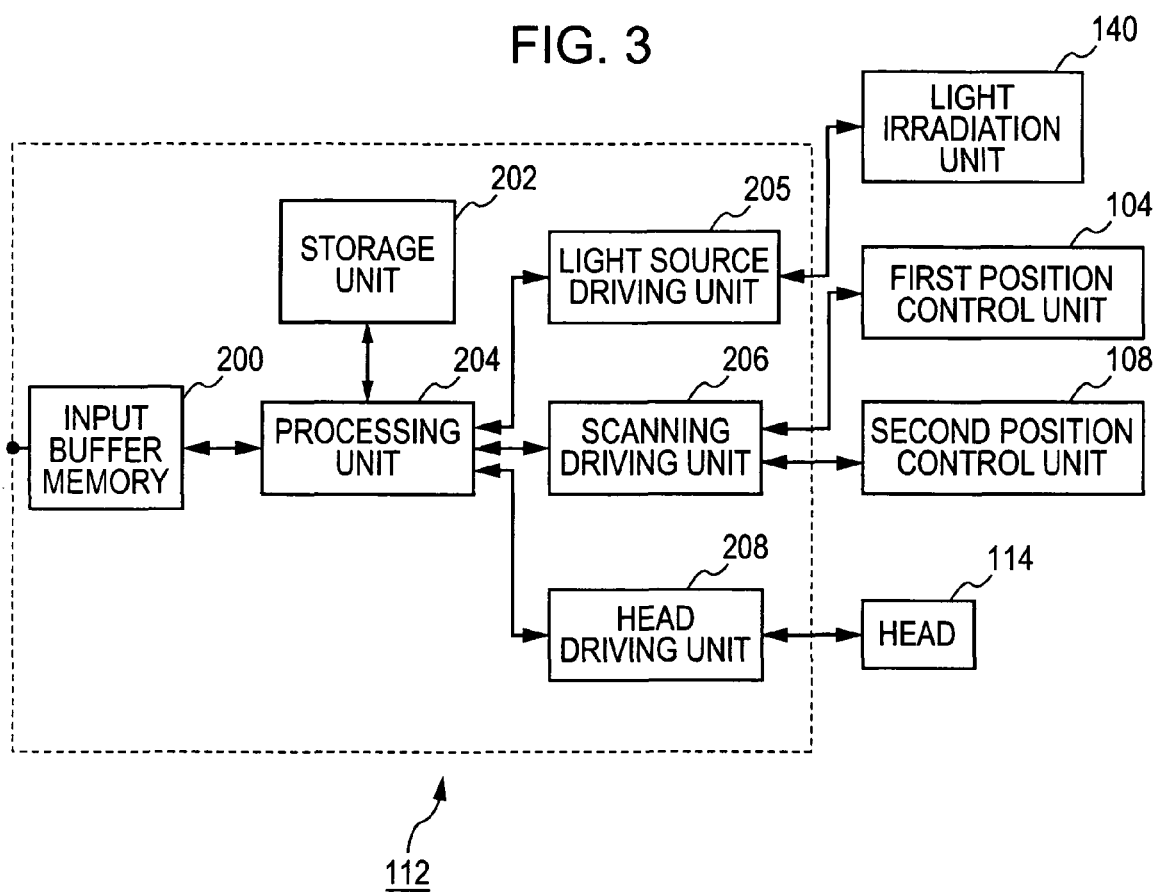
FIG. 3 is a functional block diagram of a control system in the droplet discharge apparatus.

Next, the configuration of the control system 112 will be described. Referring to FIG. 3, the control system 112 includes an input buffer memory 200, a storage unit 202, a processing unit 204, a light source driving unit 205, a scan driving unit 206 and a head driving unit 208. The input buffer memory 200 and the processing unit 204 are communicably connected to each other. The processing unit 204, the storage unit 202, the light source driving unit 205, the scan driving unit 206 and the head driving unit 208 are communicably connected to each other through buses (not shown).

The light source driving unit 205 is communicably connected to the light irradiation unit 140. Further, the scan driving unit 206 is communicably connected to the first position control unit 104 and the second position control unit 108. In a similar manner, the head driving unit 208 is communicably connected to the head 114.

The input buffer memory 200 receives discharge data for discharging the droplet D of the liquid material 8A from an external information processing unit (not shown) which is located outside the droplet discharge apparatus 1. The input buffer memory 200 supplies the discharge data to the processing unit 204. The processing unit 204 stores the discharge data in the storage unit 202. In FIG. 3, the storage unit 202 is a random access memory (RAM).

The processing unit 204 supplies the scan driving unit 206 with data indicating the position of each nozzle 118 relative to a target discharge portion on the basis of the discharge data stored in the storage unit 202. The scan driving unit 206 supplies the first position control unit 104 and the second position control unit 108 with stage driving signals depending upon the discharge data and a discharge cycle. As a result, the position of the discharge head unit 103 relative to the target discharge portion changes. Meanwhile, the processing unit 204 applies a discharge signal necessary for the discharge of the liquid material 111 to the head 114 based on the discharge data stored in the storage unit 202. As a result, the droplet D of the liquid material 111 is discharged from a corresponding nozzle 118 in the head 114.

Further, the processing unit 204 switches the light irradiation unit 140 to either an ON state or an OFF state based on the discharge data in the storage unit 202. Specifically, the processing unit 204 supplies respective signals indicating the ON state or the OFF state to the light source driving unit 205 so that the light source driving unit 205 can set a state of the light irradiation unit 140.

The control system 112 is a computer including a CPU, a ROM, a RAM and buses. Accordingly, the above-described functions of the control system 112 can be implemented using software programs that are executed by the computer. Of course, the control system 112 may be implemented using a dedicated circuit (hardware).

Liquid Material

The above-described "liquid material 111" means a material having viscosity, which can be discharged as the droplet D from the nozzle 118 of the head 114. In this case, the liquid material 111 may be a water-based or oil-based material. The liquid material may include any material as long as it has flowability (viscosity) such that it can be discharged from the nozzle 118, and any material that is fluid as a whole even if a solid material is incorporated therein. Preferably, the viscosity of the liquid material 111 is more than 1 mPa·s and less than 50 mPa·s. If the viscosity is more than 1 mPa·s, the periphery of the nozzle 118 is hardly polluted due to the liquid material 111 when the droplet D of the liquid material 111 is discharged. On the other hand, if the viscosity is less than 50 mPa·s, smooth discharge of the droplet D can be realized because the frequency of clogging in the nozzle 118 is small.

Conductive materials 8A and 15A (FIG. 4D and FIG. 7C) as described below are kinds of the above-described liquid material 111. The conductive materials 8A and 15A of the present embodiment contain silver particles having a mean particle size of about 10 nm, and a dispersion medium. In the conductive materials 8A and 15A, the silver particles are stably dispersed in the dispersion medium. In addition, the silver particles may be coated with a coating agent. Here, the coating agent is a compound that can be coordinated in silver atoms.

The dispersion medium (or a solvent) is not particularly limited as long as it can disperse fine conductive particles, such as the silver particles, without causing aggregation. For example, the dispersion medium may include water, alcohols such as methanol, ethanol, propanol and butanol; hydrocarbon-based compounds such as n-heptane, n-octane, decane, dodecane, tetradecane, toluene, xylene, cymene, durene, indene, dipentene, tetrahydronaphthalene, decahydronaphthalene and cyclohexylbenzene; ether-based compounds such as ethyleneglycoldimethylether, ethyleneglycoldiethylether, ethyleneglycolmethylethylether, diethyleneglycoldimethylether, diethyleneglycoldiethylether, diethyleneglycolmethylethylether, 1,2-dimethoxyethane, bis(2-methoxyethyl) ether and p-dioxane; and polar compounds such as propylenecarbonate, γ-butyrolactone, N-methyl-2-pyrrolidone, dimethylformamide, dimethylsulfoxide and cyclohexanone. Among them, in terms of the dispersibility of fine conductive particles, the stability of a dispersion liquid and easy application to a droplet discharge method, water, alcohols, hydrocarbon-based compounds and ether-based compounds are preferred as the dispersion media. More preferred dispersion media might include water and hydrocarbon-based compounds.

Further, particles having a mean particle size from about 1 nm to several hundreds of nanometers are referred to as "nanoparticles". According to this notation, the conductive materials 8A and 15A include silver nanoparticles.

Further, insulating materials 7A, 9A, 11A and 17A as described below are the liquid material 111, respectively. Also, the insulating materials 7A, 9A, 11A and 17A contain a photo-curable material. Specifically, the photo-curable material of the present embodiment contains photoinitiator, acrylic acid monomers, and/or oligomer. In present embodiment, acrylic photosensitive resins are referred to as "first photo-curable material", "second photo-curable material", and "third photo-curable material", depending on processes. As thus described, the "first photo-curable material", the "second photo-curable material", and the "third photo-curable material" are the same in the present embodiment.

In general, the "photo-curable material" of the invention may contain solvent and resin dissolved in the solvent. In this case, the "photo-curable material" may contain resin which itself is exposed to light to raise the degree of polymerization or may contain resin and photoinitiator which initiates curing of the resin.

Of course, instead of such a form, the "photo-curable material" of the invention may contain monomers which are photo-polymerized to produce insoluble insulating resin, and photoinitiator which initiates photo-polymerization of the monomers. However, the "photo-curable material" in this case may not contain the photoinitiator as long as the monomers themselves have a photo-functional group.

In the following, a method of manufacturing a wiring board using a multilayer structure forming method according to the present embodiment is described.

Manufacturing Method

First, UV cleaning is carried out on one surface S of a substrate 10A. By the UV cleaning, not only the surface S is cleaned, but also the surface S exhibits an appropriate lyophilic property to a liquid insulating material 7A as described below. Therefore, in the present embodiment, the surface S after the UV cleaning becomes the above-described target discharge portion and target coating portion.

Next, as shown in FIG. 4A, the droplet discharge apparatus 1 is used to form an insulating material layer 7B on the entire surface S. Specifically, first, the substrate 10A is positioned on the stage 106 of the droplet discharge apparatus 1. Then, the droplet discharge apparatus 1 changes the position of the nozzle 118 relative to the surface S two-dimensionally (in the X-axis direction and in the Y-axis direction). Thereafter, the droplet discharge apparatus 1 discharges droplets D of the liquid insulating material 7A toward the surface S from the nozzle 118 in a predetermined period according to first discharge data. Then, a plurality of droplets D land over the whole area of the surface S at predetermined pitches and spread thereon. As a result, the insulating material layer 7B covering the surface S is obtained when the plurality of landed droplets D spread. In addition, the volume and number of droplets D of the insulating material layer 7A to be discharged are set such that the thickness of an insulating layer 7 (FIG. 4C) obtained after a curing process as described below is about 10 μm.

In addition, FIG. 4 shows an YX cross-section of the substrate 10A. Further, in the present embodiment, the substrate 10A and one or more layers on the substrate 10A are collectively referred to as "base 10B".

Next, as shown in FIGS. 4B and 4C, the obtained insulating material layer 7B is cured to form an insulating layer 7. Specifically, the insulating material layer 7B is irradiated with the light having a first wavelength belonging to an ultraviolet region from the light irradiation unit 140 for about 60 seconds, thereby obtaining an insulating layer 7. In present embodiment, the wavelength of the light to be radiated on the insulating material layer 7B is 365 nm.

In this way, since the insulating material layer 7B to be a base is cured before a pattern (FIG. 4D) of a conductive material layer 8B as described below is formed, disconnection will not occur in the pattern of the conductive material layer 8B.

Next, as shown in FIG. 4D, the droplet discharge apparatus 2 is used to form a pattern of the conductive material layer 8B on the insulating layer 7. Specifically, first, the substrate 10A is positioned on the stage 106 of the droplet discharge apparatus 2. Then, the droplet discharge apparatus 2 changes the position of the nozzle 118 relative to the surface of the insulating layer 7 two-dimensionally. Thereafter, the droplet discharge apparatus 2 discharges a droplet D of the liquid conductive material 8A toward the surface of the insulating layer 7 from the nozzle 118 whenever the nozzle 118 reaches a position corresponding to the pattern of the conductive material layer 8B according to second discharge data. Then, a plurality of droplets D land and spread on the insulating layer 7. After that, as a plurality of landed droplets D spread, a pattern of the conductive material layer 8B is formed on the insulating layer 7. In addition, the volume and number of droplets D of the conductive material 8A to be discharged are set such that the thickness of a conductive layer 8 (FIG. 5B) obtained after a heating process as described below is about 4 μm.

Here, the droplet discharge apparatus 2 of the present embodiment corresponds to "the first droplet discharge apparatus" of the invention. Further, the surface of the insulating layer 7 is an example of the "object surface" of the invention.

Figure 5A:
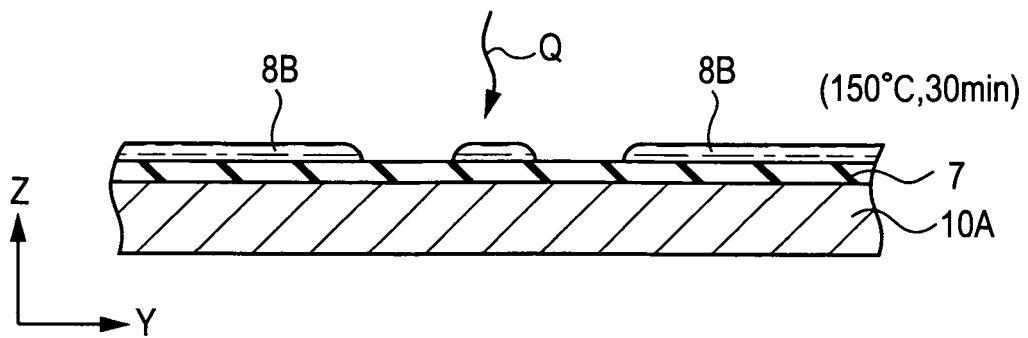
FIGS. 5A to 5C illustrate the method of manufacturing a wiring board according to the first embodiment.
Figure 5B:
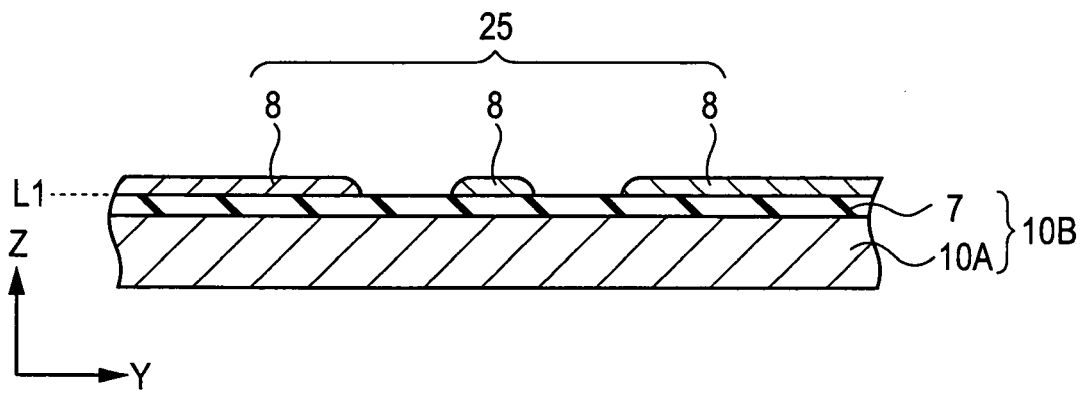

Next, as shown in FIG. 5A, the pattern of the conductive material layer 8B is activated to form a pattern of a conductive layer 8 shown in FIG. 5B. Specifically, a clean heater is used to bake (heat) the pattern of the conductive material layer 8B at a temperature of 150° C. for 30 minutes. Then, the silver particles in the conductive material layer 8B are sintered or fused whereby the pattern of the conductive layer 8 is obtained. In present embodiment, the pattern of the conductive layer 8 is referred to "wiring pattern 25 (or conductive pattern)". In addition, FIGS. 5A and 5B show an YZ cross-section of the base 10B.

In this way, in the present embodiment, the conductive material layer 8B is baked in advance to form the conductive layer 8 before an insulating pattern 11 (as described below) covering the insulating layer 7 and the wiring pattern 25 is provided. Then, the conductive layer 8 is even less likely to be deformed under a stress caused by shrinkage on curing of an insulating material pattern 9B. This is because the adhesion between the insulating layer 7 and the conductive layer 8 is stronger than the adhesion between the insulating layer 7 and the conductive material layer 8B (the conductive layer 8 before being activated).

Further, the wiring pattern 25 is located on the insulating layer 7 made of acrylic resin. Since the insulating layer 7 made of acrylic resin functions to adhere the substrate 10A made of polyimide to the wiring pattern 25 made of silver, the wiring pattern 25 of the present embodiment is hardly peeled off.

Figure 5C:
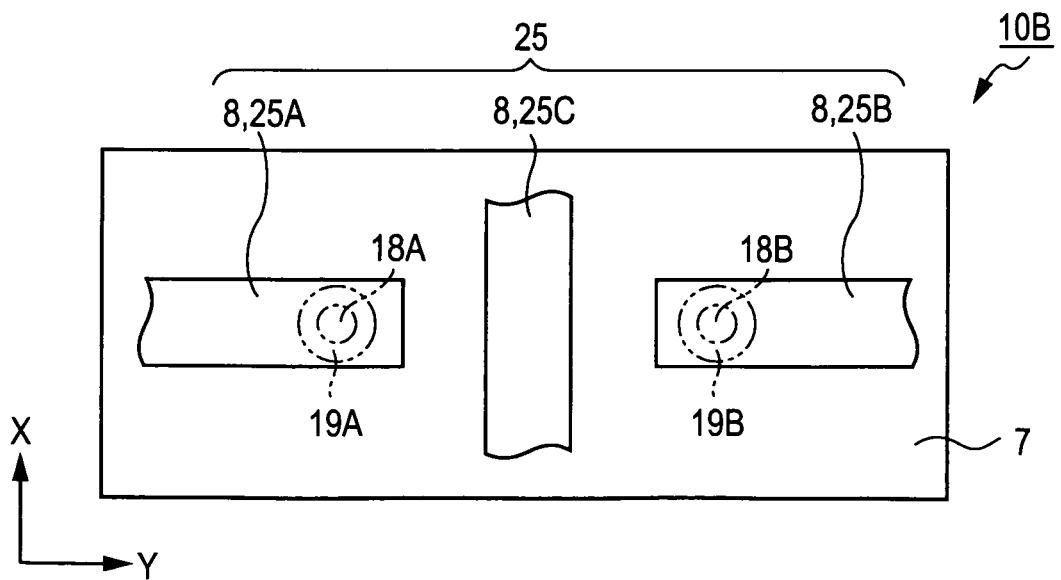

As shown in FIG. 5C, the wiring pattern 25 includes a wiring line 25A, a wiring line 25B, and a wiring line 25C. All the wiring lines 25A, 25B and 25C have a stripe shape. The width of each of the wiring lines 25A, 25B and 25C is about 50 μm. More specifically, each of the wiring lines 25A, 25B and 25C is located on a portion of the insulating layer 7 that is a so-called "solid film". In other words, all the wiring lines 25A, 25B and 25C are located on a surface L1 at almost the same level. However, two arbitrary wiring lines of the wiring lines 25A, 25B and 25C are physically separated from each other on the surface L1. In addition, by means of processes as described below, the wiring line 25A and the wiring line 25B are wiring lines which should be electrically connected to each other. On the other hand, the wiring line 25C is a wiring line which should be electrically insulated from both the wiring line 25A and the wiring lines 25B. In addition, FIG. 5C shows an XY plane of the base 10B.

In present embodiment, a post formation region 18A is set on the wiring line 25A, and a post formation region 18B is set on the wiring line 25B. The post formation regions 18A and 18B are positions where conductive posts are provided afterwards. In addition, an underlying region 19A is located so as to surround the post formation region 18A, and an underlying region 19B is located so as to surround the post formation region 18B.

Next, as shown in FIG. 6A, the droplet discharge apparatus 3 is used to provide insulating material patterns 9B on underlying regions 19A and 19B, respectively.

First, the substrate 10A is positioned on the stage 106 of the droplet discharge apparatus 3. Then, the droplet discharge apparatus 3 changes the position of the nozzle 118 relative to the surface of the base 10B two-dimensionally. Thereafter, the droplet discharge apparatus 3 discharges a droplet D of the liquid conductive material 9A toward the underlying regions 19A and 19B from the nozzle 118 whenever the nozzle 118 reaches a position corresponding to the underlying regions 19A and 19B according to third discharge data. Then, a plurality of droplets D land and spread on the underlying regions 19A and 19B. After that, each insulating material pattern 9B is formed on the underlying regions 19A and 19B when the plurality of landed droplets D spread.

In addition, the droplet discharge apparatus 3 of the present embodiment corresponds to "the second droplet discharge apparatus" of the invention.

Here, the underlying regions 19A and 19B are the surface of the wiring pattern 25 made of silver, and the underlying regions 19A and 19B exhibit a lyophobic property against the insulating material 9A. Therefore, the droplets D of the insulating material 9A, which have landed on the underlying regions 19A and 19B, have a low degree of spreading. Accordingly, the underlying regions 19A and 19B are suitable to shape via holes by an inkjet method.

Next, as shown in FIGS. 6B and 6C, two insulating material patterns 9B are cured to form two insulating patterns 9. Specifically, the insulating material patterns 9B are irradiated with the light having a first wavelength belonging to an ultraviolet region from the light irradiation unit 140 for about 60 seconds, thereby obtaining insulating patterns 9. In present embodiment, the wavelength of the light to be irradiated on the insulating material patterns 9B is 365 nm. Also, the insides of the two insulating patterns 9 become via holes 40A and 40B, respectively. In other words, the two insulating patterns 9 border the via holes 40A and 40B, respectively.

After the insulating patterns 9 have been formed, as shown in FIG. 6D, the underlying region 20 is made lyophilic. Here, the underlying region 20 is a region that touches the underlying regions 19A and 19B and surrounds the underlying regions 19A and 19B. Alternatively, the underlying region 20 is a surface that is neither the post formation regions 18A and 18B nor the underlying regions 19A and 19B. In present embodiment, the underlying region 20 is composed of a portion of the surface of the wiring pattern 25 and a portion of the surface of the insulating layer 7.

When the underlying region 20 is made lyophilic, specifically, the surface of the underlying region 20 is uniformly irradiated with the light of a second wavelength different from the first wavelength for about 60 seconds. Then, the surface of the insulating layer 7 that is a portion of the underlying region 20 exhibits a hydrophilic property to a liquid insulating material 11A (FIG. 7A) as described below. In addition, in the present embodiment, the second wavelength is 172 nm.

In addition, one of indexes indicating the lyophilic degree is an "angle of contact". In present embodiment, when a droplet D of the insulating material 11A comes into contact with the surface of the insulating layer 7 which has been made lyophilic, the angle of contact between the droplet D and the surface of the insulating layer 7 is less than 20 degrees.

The reason why the surface of the insulating layer 7 is made lyophilic is as follows. When the surface of insulating layer 7 goes through a curing process for obtaining the insulating patterns 9, a curing process for obtaining the insulating layer 7, or a baking (heating) process for obtaining the wiring pattern 25, it exhibits a lyophobic property against the liquid insulating material 11A. It is noted herein that when the object exhibits the lyophobic property, it becomes difficult to form a uniform layer over a broad area. In contrast, in the present embodiment, the degree (lyophilic degree) that a droplet of the insulating material 11A spread increases again over the surface of the insulating layer 7 because the surface of the insulating layer 7 is made lyophilic after the baking process. Therefore, an insulating pattern 11 having a flat surface can be formed on the insulating layer 7.

Next, the droplet discharge apparatus 4 is used to form an insulating material pattern 11B on the underlying region 20. Specifically, as shown in FIG. 7A, first, the substrate 10A is positioned on the stage 106 of the droplet discharge apparatus 4. Then, the droplet discharge apparatus 4 changes the position of the nozzle 118 relative to the underlying region 20 two-dimensionally. Thereafter, the droplet discharge apparatus 4 discharges a droplet D of the liquid insulating material 11A toward the surface of the insulating layer 7 or the surface of the wiring pattern 25 from the nozzle 118 whenever the nozzle 118 reaches a position corresponding to the insulating material pattern 11A according to fourth discharge data. Then, a plurality of droplets D land and spread on the underlying region 20. After that, the insulating material pattern 11B is formed on the insulating layer 7 and the wiring pattern 25 when a plurality of landed droplets D spread. In other words, the insulating material pattern 11B surrounding the insulating patterns 9 is obtained.

In addition, the droplet discharge apparatus 4 of the present embodiment corresponds to "the third droplet discharge apparatus" of the invention.

As described above, the surface of the insulating layer 7 exhibits a lyophilic property to the liquid insulating material 11A by means of the preceding hydrophilic treatment process. Therefore, the droplet D of the insulating material 11A that has landed on the surface of the insulating layer 7 can spread uniformly on these surfaces. In addition, the volume and number of droplets D to be discharged are set in the fourth discharge data so that a step (about 4 μm high) formed between the insulating layer 7 and the wiring pattern 25 located on the insulating layer 7 can be absorbed by the insulating material pattern 11B. Therefore, the surface of the insulating pattern 11 obtained after a curing process as described below becomes flat over the insulating pattern 11.

Next, as shown in FIGS. 7B and 7C, the insulating material pattern 11B is cured to form an insulating pattern 11. Specifically, the insulating material pattern 11B is irradiated with the light having a first wavelength belonging to an ultraviolet region from the light irradiation unit 140 for about 60 seconds, thereby obtaining an insulating pattern 11. In present embodiment, the wavelength of the light to be irradiated on the insulating material pattern 11B is 365 nm.

Since the underlying regions 19A and 19B touch the underlying region 20, the insulating pattern 11 also touches the insulating patterns 9 which have been formed in advance. Further, the thickness of the insulating pattern 11 is about 10 μm on the insulating layer 7 and about 6 μm on the wiring pattern 25. In addition, discharge scanning of droplets D by the droplet discharge apparatus 4 is set such that the surfaces of the insulating patterns 9 and the surface of the insulating pattern 11 constitute a surface L3 of the same level.

After the insulating pattern 11 has been formed, as shown in FIG. 7C, the droplet discharge apparatus 5 is used to fill via holes 40A and 40B bordered by the insulating patterns 9 with a conductive material 15A.

Specifically, first, the droplet discharge apparatus 5 changes the position of the nozzle 118 relative to the base 10B two-dimensionally. Then, when the nozzle 118 has reached positions corresponding to via holes 40A and 40B, the droplet discharge apparatus 5 discharges a droplet D of the conductive material 15A from the nozzle 118. The discharged droplet D of the conductive material 15A lands on a pattern (conductive pattern 25) of the conductive layer 8 exposed by the via holes 40A and 40B. Then, enough droplets to fill the via holes 40A and 40B land within the via holes 40A and 40B whereby as shown in FIG. 7C, the via holes 40A and 40B are filled with the conductive material 15A.

In addition, the droplet discharge apparatus 5 of the present embodiment corresponds to "the fourth droplet discharge apparatus" of the invention.

Next, the droplet discharge apparatus 5 is used again to discharge a droplet D of the conductive material 15A to form a conductive material pattern 15B connecting the two via holes 40A and 40B together on the insulating patterns 9 and 11.

Figure 8A:
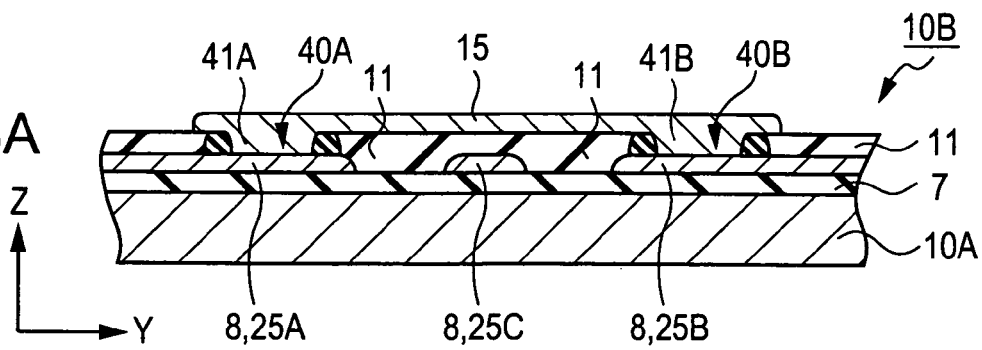
FIGS. 8A and 8B illustrate the method of manufacturing a wiring board according to the first embodiment.

Then, the conductive material 15A within the via holes 40A and 40B and the conductive material pattern 15B are activated. In present embodiment, as shown in FIG. 7D, the fine silver particles in the conductive material 15A are sintered and fused by heating them with heat quantity Q. Specifically, a clean oven is used to heat the base 10B at 150 degrees for 30 minutes. As a result of such activation, as shown in FIG. 8A, conductive posts 41A and 41B located within the two via holes 40A and 40B, respectively, and a wiring pattern 15 connected to the conductive posts 41A and 41B are obtained.

By means of the conductive posts 41A and 41B and the wiring pattern 15, a wiring line 25A and a wiring line 25B that are portions of the wiring pattern 25 are electrically connected to each other. On the other hand, a wiring line 25C that is a portion of the wiring pattern 25 is electrically insulated from both the wiring line 25A and the wiring line 25B.

Next, the surfaces of the insulating patterns 9 and 11 and the surface of the wiring pattern 15 are made lyophilic. Specifically, the surface of the base 10B is uniformly irradiated with the light of the second wavelength for about 60 seconds. Then, the surfaces of the insulating patterns 9 and 11 and the surface of the wiring pattern 15 exhibit a lyophilic property to a liquid insulating material 17A as described below. As described above, the second wavelength is 172 nm.

Thereafter, although not shown, an insulating material layer covering the insulating patterns 9 and 11 and the wiring pattern 15 is formed by means of a discharge process using the droplet discharge apparatus 6.

Then, the obtained insulating material layer is cured to form an insulating layer 17. Specifically, the above-mentioned insulating material layer is irradiated with the light having a first wavelength belonging to an ultraviolet region from the light irradiation unit 140 for about 60 seconds, thereby obtaining an insulating layer 17. In present embodiment, the first wavelength is 365 nm. The insulating layer 17 is a so-called solid film.

Figure 8B:
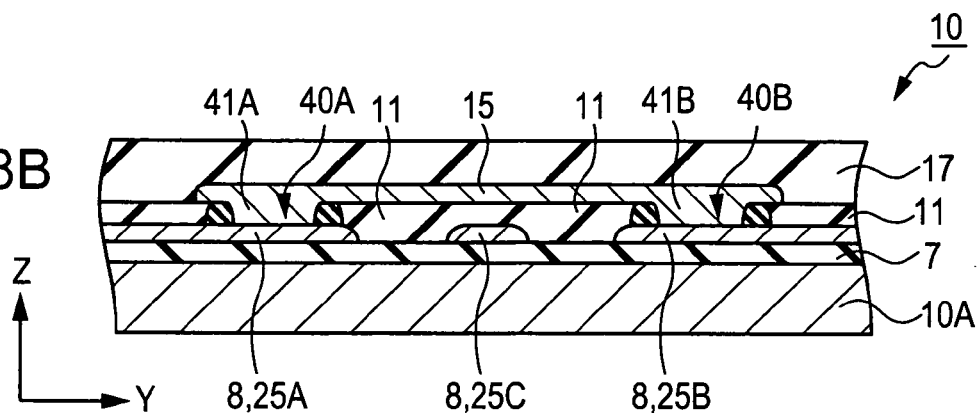

Thereafter, the base 10B is heated again by a clean oven, thereby causing polymerization reaction of polymers in the insulating layer 7, the insulating patterns 9 and 11, and the insulating layer 17 to proceed completely. Through the above-mentioned processes, the wiring board 10 shown in FIG. 8B is obtained from the base 10B.

Second Embodiment

A multilayer structure forming method of the present embodiment is the same as the multilayer structure forming method of the first embodiment except the method of forming an insulating pattern 11. Therefore, description of the same processes and configuration of present embodiment as those of the first embodiment will be omitted in order to avoid redundancy.

First, as described in the first embodiment, insulating patterns 9 are respectively provided in underlying regions 19A and 19B on a wiring pattern (FIGS. 6A to 6C). Thereafter, the surface of an insulating layer 7 is made lyophilic by irradiating an underlying region 20 with light (FIG. 6D). Then, the following processes are carried out so that a discharge process for forming an insulating pattern can be always performed on a flat surface.

Figure 9A:
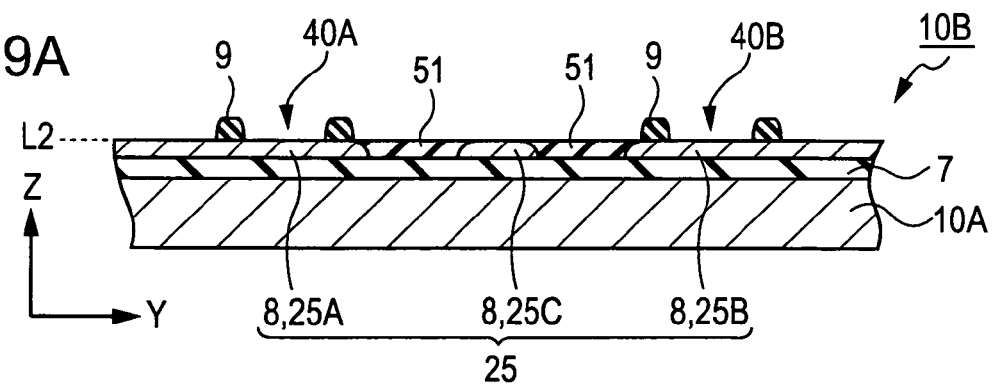
FIGS. 9A and 9B illustrate a method of manufacturing a wiring board according to a second embodiment.

As shown in FIG. 9A, an insulating pattern 51 is provided in a portion on the insulating layer 7 with no wiring pattern 25, by means of a discharge process and a curing process. Since the thickness of the insulating pattern 51 is set to be equal to the thickness of the wiring pattern 25, a step created by the wiring pattern 25 is eliminated. In other words, the wiring pattern 25 and the insulating pattern 51 forms a surface L2 of almost the same level.

Next, although not shown, the surface L2 is made lyophilic by irradiating the surface L2 with the light with a wavelength of 172 nm.

Figure 9B:
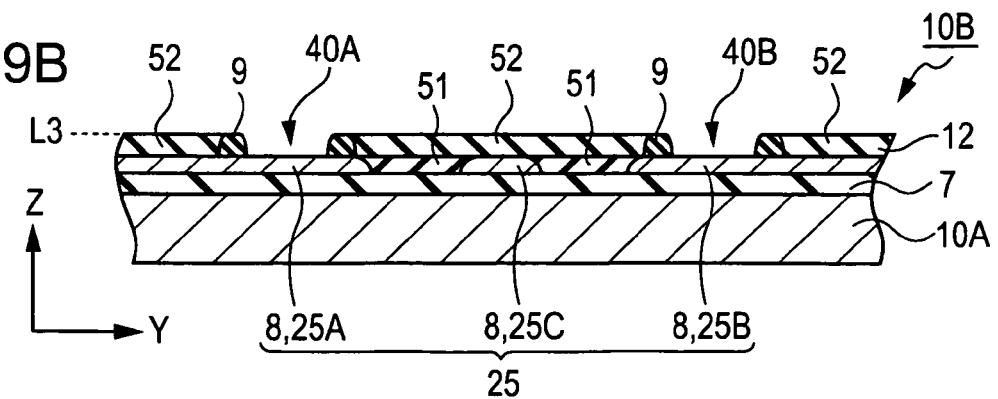

Then, an insulating pattern 52 is provided in a portion of the surface L2 with neither the insulating patterns 9 nor the via holes 40A and 40B, by means of a discharge process and a curing process. This allows an insulating pattern 52 surrounding the insulating patterns 9 to be obtained, as shown in FIG. 9B. Since the thickness of the insulating pattern 52 is set to be equal to the thickness of the insulating patterns 9, the insulating pattern 52 and the insulating patterns 9 form a surface L3 of almost the same level.

Thereafter, a wiring board 10 can be formed by performing the same processes as those in the first embodiment.

The insulating pattern 51 and the insulating pattern 52 of the present embodiment correspond to the insulating pattern 11 of the first embodiment. In this way, in the present embodiment, portions corresponding to the insulating pattern 11 of the first embodiment are formed through a plurality of times of "discharge forming". The "discharge forming" means forming a material pattern by a discharge process and curing a material pattern by a curing process.

If such processes are performed, an insulating pattern is always provided on a flat surface. Therefore, the sides of the wiring pattern 25 can be coated well with an insulating pattern even when the thickness of the wiring pattern 25 is large.

In addition, in the above-described processes, a hydrophilic treatment process by irradiation by light may be performed on the underlying insulating pattern 51 before the discharge process for forming the insulating pattern 52 is performed.

Third Embodiment

In the following, a method of manufacturing a wiring board using a multilayer structure forming method according to the present embodiment is described.

First, a substrate 10A provided with a wiring pattern 25P, as shown FIGS. 10A and 10B, is prepared. It is noted herein that the wiring pattern 25P have a structure in which the surface of a copper wiring line is plated with gold (Au). Of course, the entire wiring pattern 25P may be made of gold (Au). In present embodiment, such a wiring pattern 25P is located on the surface of the substrate 10A. As such, the surface of the substrate 10A is an example of "object surface" of the invention. In addition, in the following, the substrate 10A and one or more layers on the substrate 10A are collectively referred to as "base 10B".

As shown in FIG. 10B, the wiring pattern 25P includes a wiring line 25PA, a wiring line 25PB, and a wiring line 25PC. All the wiring lines 25PA, 25PB and 25PC have a stripe shape. The width of each of the wiring lines 25PA, 25PB and 25PC is about 50 μm. More specifically, each of the wiring lines 25PA, 25PB and 25PC is located on a portion of the substrate 10A. In other words, all the wiring lines 25PA, 25PB and 25PC are located on a surface L1 at almost the same level. However, two arbitrary wiring lines of the wiring lines 25PA, 25PB and 25PC are physically separated from each other on the surface L1. In addition, by means of processes as described below, the wiring line 2P5A and the wiring line 25PB are wiring lines which should be electrically connected to each other. On the other hand, the wiring line 25PC is a wiring line which should be electrically insulated from both the wiring line 25PA and the wiring lines 25PB. In addition, FIG. 10B shows an XY plane of the base 10B. The XY plane is a plane parallel to both the X-axis direction and the Y-axis direction.

Next, as shown in FIGS. 10C and 10D, the surface of the substrate 10A and the surface of the wiring pattern 25P are made lyophobic. Specifically, a fluoroalkyl silane (hereinafter referred to as FAS) film 16 is formed on the substrate 10A. More specifically, a solution of a raw material compound (i.e., FAS) and the substrate 10B are put in the same sealed vessel, and left at room temperature for about two or three days. By doing so, a self-assembled film (i.e., FAS film 16) such as an organic molecule film is formed on the surface of the substrate 10A and the surface of the wiring pattern 25P.

In present embodiment, the expressions "the surface of the substrate 10A which has been made lyophobic" or "the surface of the wiring pattern 25P which has been made lyophobic" refers to the surface of the FAS film 16 to be located on the substrate 10A or the wiring pattern 25P. In addition, FIG. 10C shows an YZ cross-section of the substrate 10A. The YZ cross-section is a surface that is parallel to the Y-axis direction and Z-axis direction.

Referring back to FIG. 10B, in the present embodiment, the post formation region 18A is set on the surface of the wiring line 25PA which has been made lyophobic, and the post formation region 18B is set on the surface of the wiring line 25PB which has been made lyophobic. The post formation regions 18A and 18B are positions where conductive posts are provided afterwards. In addition, an underlying region 19A is located so as to surround the post formation region 18A, and an underlying region 19B is located so as to surround the post formation region 18B.

Next, as shown in FIG. 11A, the droplet discharge apparatus 3 is used to provide insulating material patterns 9B on underlying regions 19A and 19B, respectively.

Specifically, first, the substrate 10A is positioned on the stage 106 of the droplet discharge apparatus 3. Then, the droplet discharge apparatus 3 changes the position of the nozzle 118 relative to the surface of the base 10B two-dimensionally. Thereafter, the droplet discharge apparatus 3 discharges a droplet D of a liquid conductive material 9A toward the underlying regions 19A and 19B from the nozzle 118 whenever the nozzle 118 reaches a position corresponding to the underlying regions 19A and 19B. Then, a plurality of droplets D land and spread on the underlying regions 19A and 19B. After that, the insulating material pattern 9B is formed on the underlying regions 19A and 19B when the plurality of landed droplets D spread.

Here, the underlying regions 19A and 19B are the surface of the wiring pattern 25P which has been lyophobic, and the underlying regions 19A and 19B exhibit a lyophobic property against the insulating material 9A. Therefore, the droplets D of the insulating material 9A which have landed on the underlying regions 19A and 19B have a low degree of spreading. Accordingly, the underlying regions 19A and 19B are suitable to shape via holes by an inkjet method.

Next, as shown in FIGS. 11B and 11C, two insulating material patterns 9B are cured to form two insulating patterns 9. Specifically, the insulating material patterns 9B are irradiated with the light of a first wavelength belonging to an ultraviolet region from the light irradiation unit 140 for about 60 seconds, thereby obtaining insulating patterns 9. In present embodiment, the first wavelength is 365 nm. Also, the insides of the two insulating patterns 9 become via holes 40A and 40B, respectively. In other words, the two insulating patterns 9 border the via holes 40A, 40B, respectively.

After the insulating patterns 9 have been formed, as shown in FIG. 11D, the underlying region 20 is made lyophilic. Here, the underlying region 20 is a region that touches the underlying regions 19A and 19B and surrounds the underlying regions 19A and 19B. Alternatively, the underlying region 20 is a surface that is neither the post formation regions 18A and 18B nor the underlying regions 19A and 19B. In present embodiment, the underlying region 20 is composed of a portion of the surface of the wiring pattern 25P and a portion of the surface of the substrate 10A.

When the underlying region 20 is made lyophilic, specifically, the surface of the underlying region 20 is uniformly irradiated with the light of a second wavelength belonging to an ultraviolet region for about 60 seconds. Then, a portion of the FAS film corresponding to the underlying region 20 is decomposed. As a result, the surface of the underlying region 20 (the surface of the substrate 10A and the surface of the wiring pattern 25P) is exposed. Then, the exposed surface of the underlying region 20 exhibits a lyophilic property to an insulating material 11A (FIG. 12A) as described below by irradiation by light. In addition, in the present embodiment, the second wavelength is 172 nm.

In addition, one of indexes indicating the lyophilic degree is an "angle of contact". In present embodiment, when a droplet D of the insulating material 11A comes into contact with the surface of the substrate 10A which has been made lyophilic, the contact angle formed between the droplet D and the surface of the substrate 10A is less than 20 degrees.

Figure 12A:
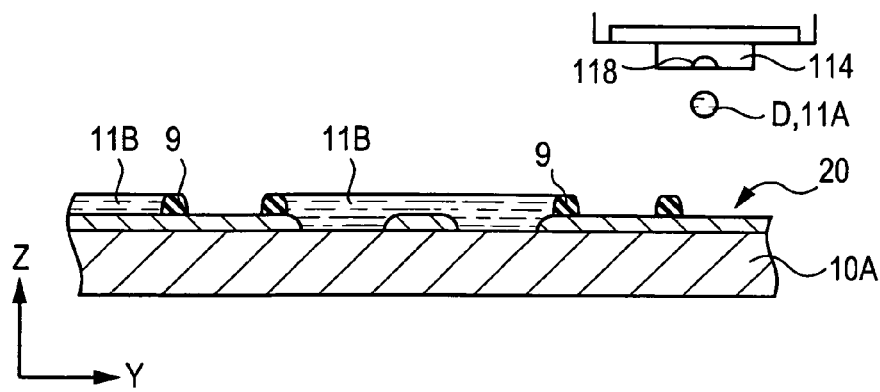
FIGS. 12A to 12D illustrate the method of manufacturing a wiring board according to the third embodiment.

Next, as shown in FIG. 12A, the droplet discharge apparatus 4 is used to form an insulating material pattern 11B on the underlying region 20.

Specifically, first, the substrate 10A is positioned on the stage 106 of the droplet discharge apparatus 4. Then, the droplet discharge apparatus 4 changes the position of the nozzle 118 relative to the underlying region 20 two-dimensionally. Thereafter, the droplet discharge apparatus 4 discharges a droplet D of the liquid conductive material 11A toward the underlying region 20 (the surface of the substrate 10A which has been made lyophilic and the surface of the wiring pattern 25P which has been made lyophilic) from the nozzle 118 whenever the nozzle 118 reaches a position corresponding to the pattern of the underlying region 20. Then, a plurality of droplets D land and spread on the underlying region 20. After that, the insulating material pattern 11B is formed on the substrate 10A and the wiring pattern 25P when a plurality of landed droplets D spread. In other words, the insulating material pattern 11B surrounding the insulating patterns 9 is obtained.

As described above, the surface of the substrate exhibits a lyophilic property to the liquid insulating material 11A by means of the preceding hydrophilic treatment process. Therefore, the droplet D of the insulating material 11A that has landed on the surface of the substrate 10A, can spread uniformly on these surfaces. In addition, the volume and number of droplets D to be discharged are set in the discharge data so that a step (about 4 μm high) formed between the substrate 10A and the wiring pattern 25P located on the substrate 10A can be absorbed by the insulating material pattern 11B. Therefore, the surface of the insulating pattern 11 obtained after a curing process as described below becomes flat over the insulating pattern 11.

Figure 12B:
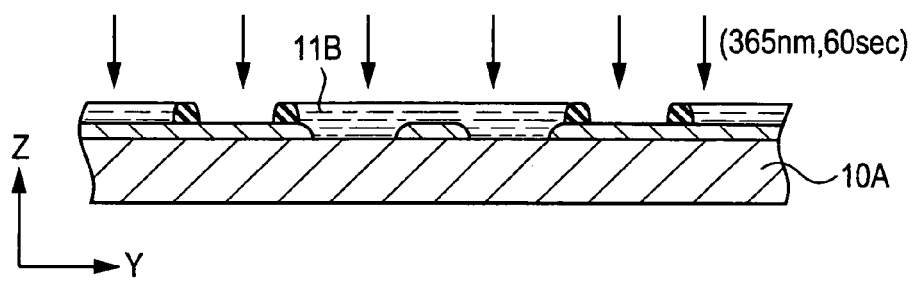
Figure 12C:
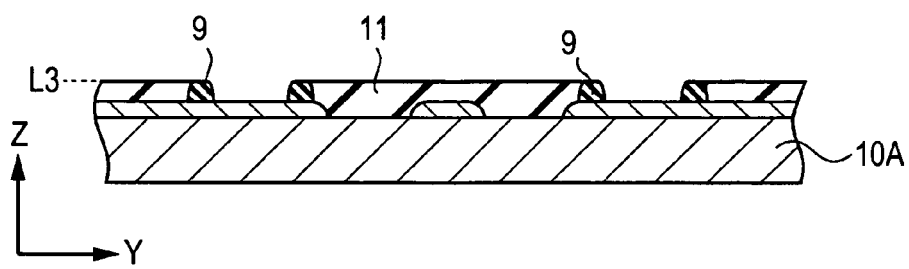

Next, as shown in FIGS. 12B and 12C, the insulating material pattern 11B is cured to form an insulating pattern 11. Specifically, the insulating material pattern 11B is irradiated with the light of a first wavelength belonging to an ultraviolet region from the light irradiation unit 140 for about 60 seconds, thereby obtaining an insulating pattern 11. In present embodiment, the first wavelength is 365 nm.

Since the underlying regions 19A and 19B touch the underlying region 20, the insulating pattern 11 also touches the insulating patterns 9 which have been formed in advance. Further, the thickness of the insulating pattern 11 is about 10 μm on the substrate 10A and about 6 μm on the wiring pattern 25P. In addition, discharge scanning of droplets D by the droplet discharge apparatus 4 is set such that the surfaces of the insulating patterns 9 and the surface of the insulating pattern 11 constitute a surface L3 of the same level.

Figure 12D:
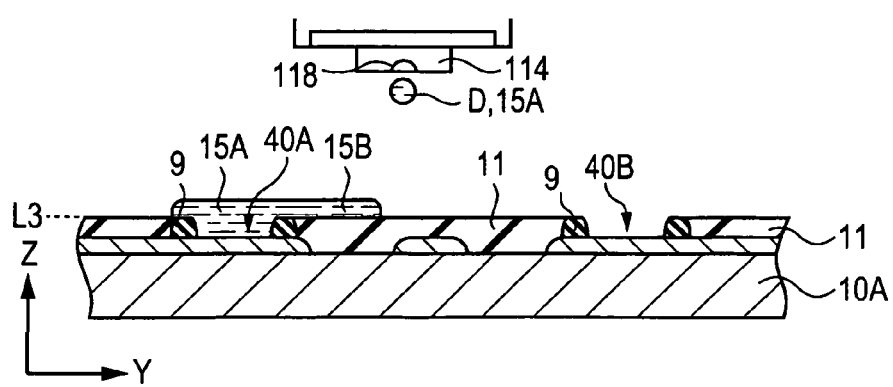

After the insulating pattern 11 has been formed, as shown in FIG. 12D, the droplet discharge apparatus 5 is used to fill via holes 40A and 40B bordered by the insulating patterns 9 with a conductive material 15A.

Specifically, first, the substrate 10A is positioned on the stage 106 of the droplet discharge apparatus 5. Then, the droplet discharge apparatus 5 changes the position of the nozzle 118 relative to the base 10B two-dimensionally. Then, when the nozzle 118 has reached positions corresponding to via holes 40A and 40B, the droplet discharge apparatus 5 discharges a droplet D of the conductive material 15A from the nozzle 118. The discharged droplet D of the conductive material 15A lands on the conductive pattern 25P exposed by the via holes 40A and 40B. Then, enough droplets to fill the via holes 40A and 40B land within the via holes 40A and 40B whereby as shown in FIG. 12D, the via holes 40A and 40B are filled with the conductive material 15A.

Next, the droplet discharge apparatus 5 is used again to discharge a droplet D of the conductive material 15A to form a conductive material pattern 15B connecting the two via holes 40A and 40B together on the insulating patterns 9 and 11.

Then, the conductive material 15A within the via holes 40A and 40B and the conductive material pattern 15B are activated. In present embodiment, as shown in FIG. 13A, the silver nanoparticles in the conductive material 15A are sintered and fused by heating them with heat quantity Q. Specifically, a clean oven is used to heat the base 10B at 150 degrees for 30 minutes. As a result of such activation, as shown in FIG. 13B, conductive posts 41A and 41B located within the two via holes 40A and 40B, respectively, and a wiring pattern 15 connected to the conductive posts 41A and 41B are obtained.

By means of the conductive posts 41A and 41B and the wiring pattern 15, a wiring line 25PA and a wiring line 25PB that are portions of the wiring pattern 25P are electrically connected to each other. On the other hand, a wiring line 25PC that is a portion of the wiring pattern 25P is electrically insulated from both the wiring line 25PA and the wiring line 25PB.

Next, although not shown, the surfaces of the insulating patterns 9 and 11 and the surface of the wiring pattern 15 are made lyophilic. Specifically, the surface of the base 10B is uniformly irradiated with the light of a second wavelength belonging to an ultraviolet region for about 60 seconds. Then, the surfaces of the insulating patterns 9 and 11 and the surface of the wiring pattern 15 exhibit a lyophilic property to a liquid insulating material 17A as described below. Here, the second wavelength is 172 nm.

Thereafter, although not shown, an insulating material layer covering the insulating patterns 9 and 11 and the wiring pattern 15 is formed by means of a discharge process of the liquid insulating material 17A by the droplet discharge apparatus 6.

Then, the obtained insulating material layer is cured to form an insulating layer 17. Specifically, the above-mentioned insulating material layer is irradiated with the light of a first wavelength belonging to an ultraviolet region from the light irradiation unit 140 for about 60 seconds, thereby obtaining an insulating layer 17. In present embodiment, the first wavelength is 365 nm. The insulating layer 17 is a so-called solid film.

Thereafter, the base 10B is heated again by a clean oven, thereby causing polymerization reaction of polymers in the insulating patterns 9 and 11 and the insulating layer 17 to proceed completely. Through the above-mentioned processes, the wiring board 10 shown in FIG. 13C is obtained from the base 10B.

Fourth Embodiment

A multilayer structure forming method of the present embodiment is the same as the multilayer structure forming method of the third embodiment except the method of forming an insulating pattern 11. Therefore, description of the same processes and configuration of present embodiment as those of the third embodiment will be omitted in order to avoid redundancy.

First, as described in the third embodiment, insulating patterns 9 are respectively formed in underlying regions 19A and 19B located on the surface of a wiring pattern 25P which has been made lyophobic (FIGS. 11A to 11C). Thereafter, the surface of a substrate 10A and the surface of the wiring pattern 25P are made lyophilic by irradiating the underlying region 20 with light (FIG. 11D). Then, the following processes are carried out so that a discharge process for forming an insulating pattern can be always performed on a flat surface.

As shown in FIG. 14A, an insulating pattern 51 is provided in a portion on the substrate 10A, which has been made lyophilic, with no wiring pattern 25P, by means of a discharge process and a curing process. Since the thickness of the insulating pattern 51 is set to be equal to the thickness of the wiring pattern 25P, a step created by the wiring pattern 25P is eliminated. In other words, the wiring pattern 25P and the insulating pattern 51 forms a surface L2 of almost the same level.

Next, as shown in FIG. 14B, the surface of the base 10B is made lyophilic by irradiating the surface of the base 10B with the light with a wavelength 172 nm for about 60 seconds.

Then, an insulating pattern 52 is provided in a portion of the surface L2, which has been made lyophilic, with neither the insulating pattern 9 nor the via holes 40A and 40B, by means of a discharge process and a curing process. This allows an insulating pattern 52 surrounding the insulating patterns 9 to be obtained, as shown in FIG. 14C. Since the thickness of the insulating pattern 52 is set to be equal to the thickness of the insulating patterns 9, the insulating pattern 52 and the insulating patterns 9 form a surface L3 of almost the same level.

Thereafter, a wiring board 10 can be formed by performing the same processes as those in the third embodiment.

The insulating pattern 51 and the insulating pattern 52 of the present embodiment correspond to the insulating pattern 11 of the third embodiment. In this way, in the present embodiment, portions corresponding to the insulating pattern 11 of the third embodiment are formed through a plurality of times of "discharge forming". The "discharge forming" means a combination of formation of a material pattern by a discharge process and curing of a material pattern by a curing process.

If such processes are performed, an insulating pattern is always provided on a flat surface. Therefore, the sides of the wiring pattern 25P can be coated well with an insulating pattern even when the thickness of the wiring pattern 25P is large.

Fifth Embodiment

Figure 15:
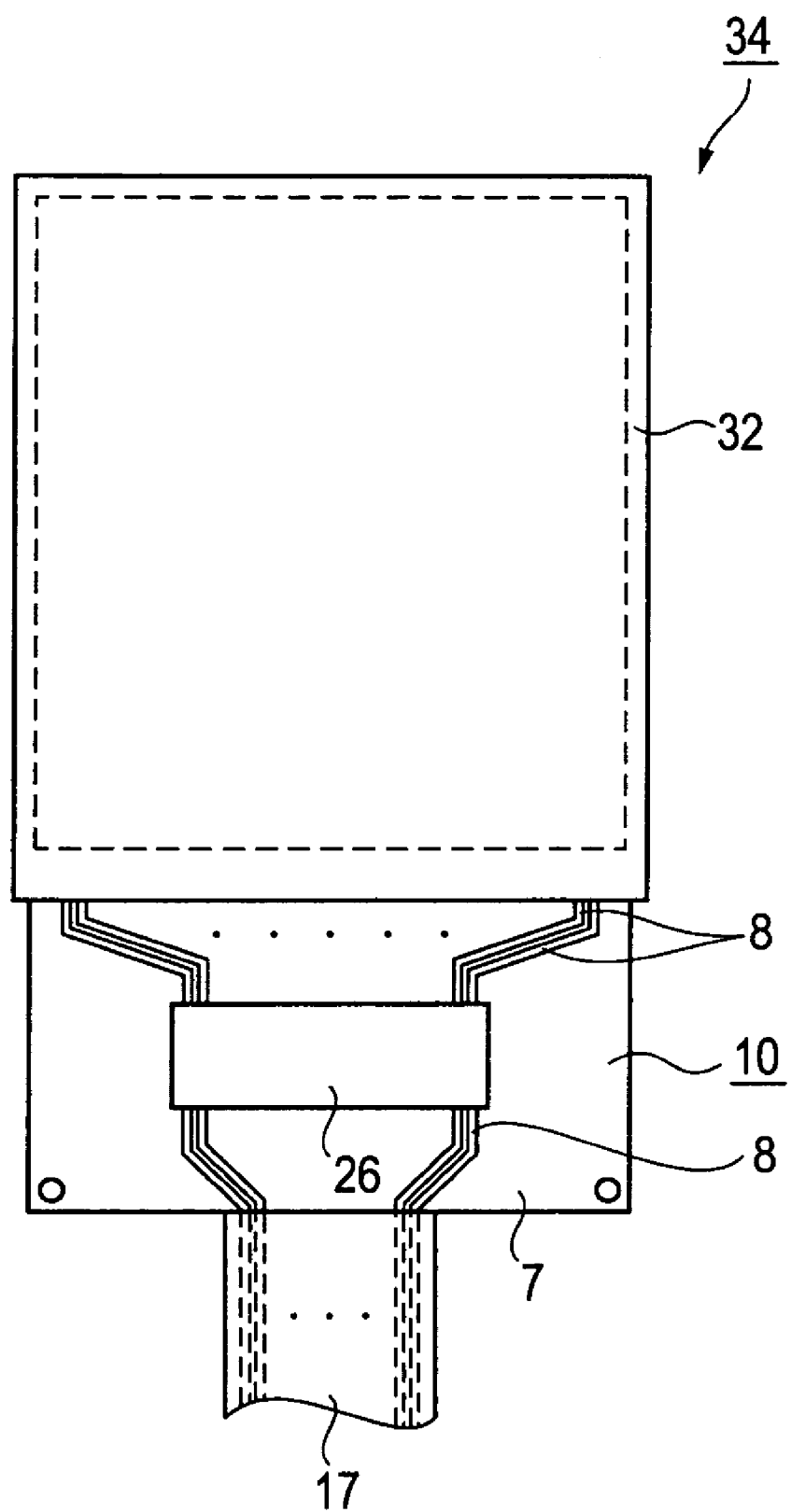
FIG. 15 is a schematic view of a liquid crystal display device according to a fifth embodiment.

Next, as shown in FIG. 15, a liquid crystal panel 32 and a semiconductor element 26 are mounted on the wiring board 10 of any one of the first to fourth embodiments. Specifically, a pattern of the conductive layer 8 is formed in a portion of the wiring substrate 10, and a portion of the pattern is covered with neither the insulating layer 17 nor the insulating patterns 9 and 11. Then, a pad corresponding to the liquid crystal pad 32 or a pad corresponding to the semiconductor element 26 is appropriately bonded to the exposed pattern of the conductive layer 8. By doing so, a liquid crystal display device 34 is obtained. In this way, the manufacturing method of the present embodiment can be applied to manufacturing of the liquid crystal display device 34. In addition, in the present embodiment, the semiconductor element 26 is a liquid crystal driver circuit.

Further, the manufacturing method of the present embodiment is applied to manufacturing of various electro-optical devices as well as manufacturing of the liquid crystal display device 34. The "electro-optical device" described in the present specification refers to all devices that project, emit, transmit or reflect light upon application of a signal voltage, without being limited to devices utilizing changes in optical characteristics (so-called electro-optical effects) such as a change in birefringence, a change in optical rotation and a change in light scattering.

Specifically, the electro-optical device is a term including a liquid crystal display device, an electroluminescent display device, a plasma display device, and a display device using a surface conduction type electron-emitter (SED), a field emission display (FED) device, etc.

Figure 16:
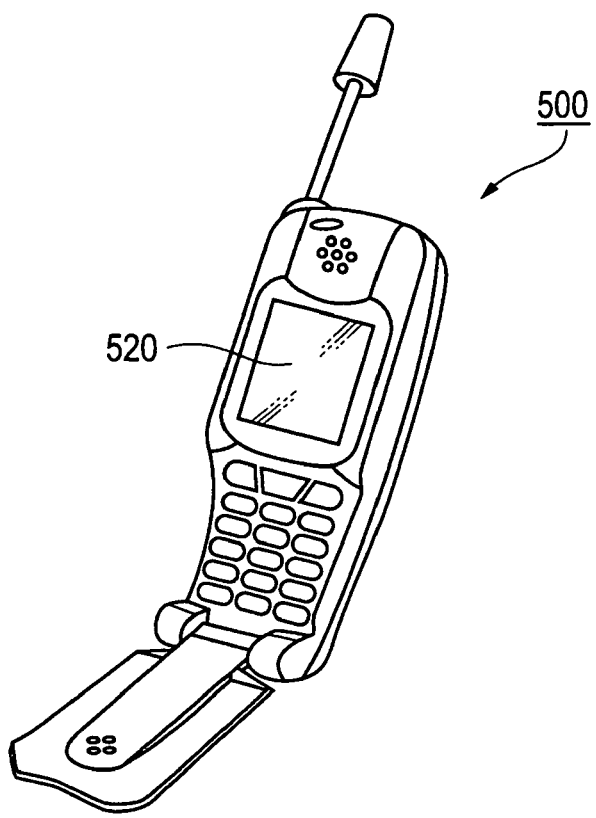
FIG. 16 is a schematic view showing a portable telephone according to the fifth embodiment.
Figure 17:
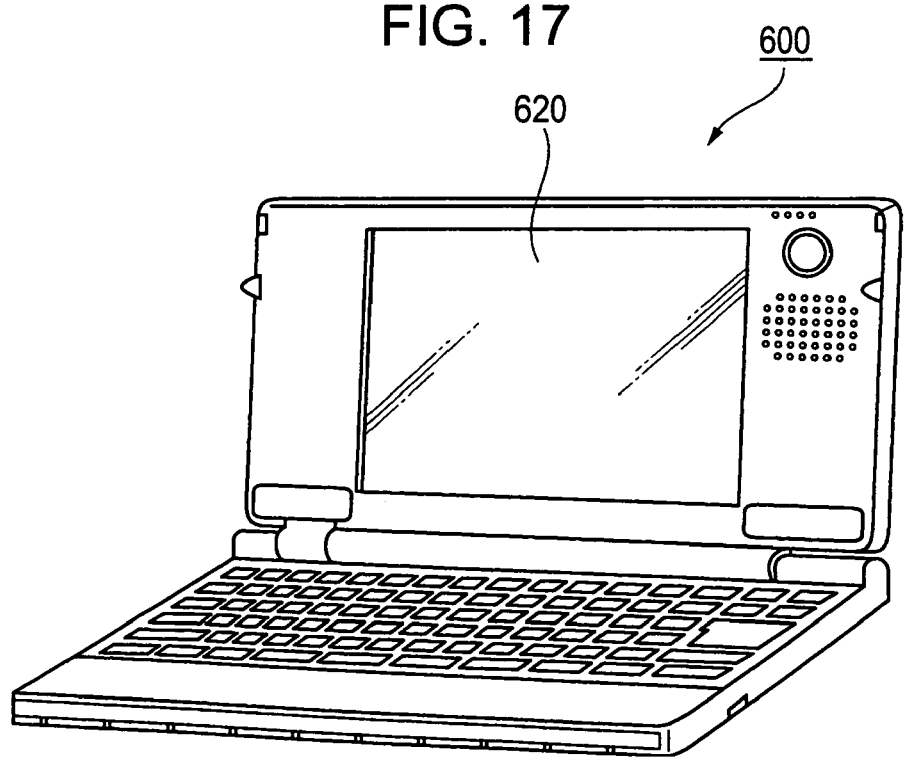
FIG. 17 is a schematic view showing a personal computer according to the fifth embodiment 5.

Moreover, the multilayer structure forming method of the present embodiment can be applied to methods of manufacturing various electronic apparatuses. For example, the manufacturing method of the present embodiment is also applied to a method of manufacturing a portable telephone 500 including an electro-optical device 520 as shown in FIG. 16 and a method of manufacturing a personal computer 600 including an electro-optical device 620 as shown in FIG. 17.

Modification 1

According to the above embodiments, six different droplet discharge apparatuses 1, 2, 3, 4, 5, and 6 discharge the insulating material 7A, the conductive material 8A, the insulating material 9A, the insulating material 11A, the conductive material 15A, and the insulating material 17A, respectively. Instead of such a construction, one droplet discharge apparatus (for example, the droplet discharge apparatus 1) may discharge all the liquid materials. In this case, the liquid materials may be discharged from separate nozzles 118 in the droplet discharge apparatus 1, or may be discharged from one nozzle 118 in the droplet discharge apparatus 1. In a case where the six liquid materials are discharged from one nozzle 118, it is desirable to add a process that cleans a channel from the tank 101 to the nozzle 118 when a liquid material is changed to another.

In a case where the six liquid materials are discharged from one nozzle, the "first droplet discharge apparatus", the "second droplet discharge apparatus", the "third droplet discharge apparatus", and the "fourth droplet discharge apparatus" in the invention correspond to the same one droplet discharge apparatus.

Modification 2

In the above embodiments, a multilayer structure is provided on the substrate 10A made of polyimide. However, even if a ceramic substrate, a glass substrate, an epoxy substrate, a glass epoxy substrate, or a silicon substrate is utilized instead of such a substrate 10A, the same effects as those described in the above embodiments can be obtained.

Modification 3

Silver nanoparticles are contained in the conductive materials 8A and 15A of the above embodiments. However, instead of the silver nanoparticles, other metal nanoparticles may be used. As the other metals, for example, any one of gold, platinum, copper, palladium, rhodium, osmium, ruthenium, iridium, iron, tin, zinc, cobalt, nickel, chrome, titanium, tantalum, tungsten, and indium may be utilized, or alloys obtained by combining two or more of those metals may be utilized. It is noted herein that since silver can be reduced to its elements at a relatively low temperature, its handling is easy. From this viewpoint, it is preferable to utilize the conductive materials 8A and 15 containing the silver nanoparticles when the droplet discharge apparatus is utilized.

Further, the conductive materials 8A and 15A may contain organic metallic compounds instead of the metal nanoparticles. The organic metallic compounds described in the specification mean compounds that metal precipitates by the decomposition by heating. Such organic metallic compounds includes, for example, chlorotriethylphosphine gold (I), chlorotrimethylphosphine gold (I), chlorotriphenylphosphine gold (I), silver (I) 2,4-pentanedionato complexes, trimethylphosphine (hexafluoroacetylacetonato) silver (I) complexes, copper (I) hexafluoropentane dionate cyclooctadiene complexes, and the like.

As described above, the form of the metals contained in the liquid conductive materials 8A and 15A may be a form of particles represented by nanoparticles, and may be a form of compounds, such as the organic metallic compounds.

Further, the conductive materials 8A and 15A may include polymeric soluble materials, such as polyaniline, polythiophene, and polyphenylenevinylene, instead of the metals.

Modification 4

As described above in the first embodiment, the silver nanoparticles in the conductive materials 8A and 15A may be coated with a coating agent, such as organic substances. As such a coating agent, amine, alcohol, thiol, and the like are known. More specifically, the coating agent includes, for example, amine compounds, such as 2-methylaminoethanol, diethanolamine, diethylmethylamine, 2-dimethylaminoethanol and methyldiethanolamine, alkylamines, ethylenediamine, alkyl alcohols, ethylene glycol, propyleneglycol, alkylthiols, ethanedithiol, and the like. The silver nanoparticles coated with the coating agent can be more stably dispersed in a dispersion medium.

Modification 5

In the first embodiment, both the insulating layer 7 and the insulating pattern 9 and 11 are made of the same material. However the insulating layer 7, the insulating pattern 9, and the insulating pattern 11 may be made of different materials. For example, the insulating layer 7 and the insulating pattern 11 may be made of acrylic resin, and the insulating pattern 9 may be made of polyimide resin. In this case, preferably, the insulating materials 7A and 9A are liquid materials containing monomers of photosensitive acrylic resin, or oligomer, and the insulating material 11A are liquid materials containing a photosensitive polyimide precursor. In other words, in this case, the "first photo-curable material" and the "second photo-curable materials" in the invention are different from each other.

Modification 6

According to the above embodiments, the surface of the insulating layer 7 and the surfaces of the insulating patterns 9 and 11 are made lyophilic by irradiating the surfaces with the light of a wavelength in an ultraviolet region. However, instead of such a lyophilic treatment, even if an $O_2$ plasma treatment using oxygen as a process gas is carried out in the atmosphere, the surface of the insulating layer 7 and the surfaces of the insulating patterns 9 and 11 can be made lyophilic. The $O_2$ plasma treatment is a treatment that a substrate 10A (base 10B) is irradiated with $O_2$ in a plasma state from a plasma discharge electrode (not shown). As for the conditions of the $O_2$ plasma treatment, preferably, the plasma power is 50 to 1000 W, the oxygen gas flow rate is 50 to 100 mL/sec, the movement speed of the base 10B relative to the plasma discharge electrode is 0.5 to 10 mm/sec, and the temperature of the base is 70 to 90° C.

Modification 7

According to the above embodiments, the insulating layer 7 is formed by the inkjet method. Specifically, the insulating material layer 7B is formed by the droplet discharge apparatus 1. However, the insulating layer 7 may be formed by other layer forming methods instead of the inkjet method. For example, the insulating layer may be formed by printing methods, such as screen printing and gravure printing.

What is claimed is:

1. A multilayer structure forming method using a droplet discharge apparatus, comprising:
   (A) discharging droplets of a first conductive material to a position corresponding to a wiring pattern to form a first conductive material pattern on a surface of an object;
   (B) baking the first conductive material pattern to form the wiring pattern;
   (C) discharging droplets of a first insulating material to a position corresponding to an underlying region surrounding a post formation region, the post formation region being positions set on the wiring pattern and surrounded by the first insulating material, the first insulating material including a first photo-curable material to form a first insulating material pattern bordering via holes on the wiring pattern;
   (D) curing the first insulating material pattern to form a first insulating pattern bordering the via holes;
   (E) making the surface of the object lyophilic;
   (F) discharging droplets of a second insulating material to a position corresponding to a second insulating pattern, the second insulating material including a second photo-curable material to form a second insulating material pattern that covers the wiring pattern and the surface of the object which has been made lyophilic, and surrounds the first insulating pattern; and
   (G) curing the second insulating material pattern to form a second insulating pattern that surrounds the first insulating pattern, the surface of the first insulating pattern and the surface of the second insulating pattern constituting a same level.

2. The multilayer structure forming method according to claim 1, wherein the first conductive material includes silver (Ag) nanoparticles.

3. The multilayer structure forming method according to claim 1, further comprising:
   (H) discharging droplets of a second conductive material into via holes to fill the via holes with the second conductive material; and
   (I) sintering the second conductive material filled in the via holes to form conductive posts.

4. A method of manufacturing a wiring board, comprising the multilayer structure forming method according to claim 1.

5. A method of manufacturing an electronic apparatus, comprising the multilayer structure forming method according to claim 1.

6. The multilayer structure forming method according to claim 1,
   the droplet discharge apparatus being an inkjet apparatus.

7. A multilayer structure forming method using a droplet discharge apparatus, comprising:
   (A) making a surface of a wiring pattern located on a surface of an object lyophobic;
   (B) discharging droplets of a first insulating material to a position corresponding to an underlying region surrounding a post formation region, the post formation region being positions set on the wiring pattern and surrounded by the first insulating material, the first insulating material including a first photo-curable material onto the surface of the wiring pattern, which has been made lyophobic, to form a first insulating material pattern bordering via holes on the wiring pattern;
   (C) curing the first insulating material pattern to form a first insulating pattern bordering the via holes;
   (D) making the surface of the object lyophilic;
   (E) discharging droplets of a second insulating material to a position corresponding to a second insulating pattern, the second insulating material including a second photo-curable material to form a second insulating material pattern that covers the wiring pattern and the surface of the object which has been made lyophilic, and surrounds the first insulating pattern; and
   (F) curing the second insulating material pattern, the surface of the first insulating pattern and the surface of the second insulating pattern constituting a same level.

8. The multilayer structure forming method according to claim 7, further comprising:
   (G) discharging droplets of a liquid conductive material to fill via holes with the conductive material; and
   (H) sintering the conductive material filled in the via holes to form conductive posts.

9. The multilayer structure forming method according to claim 8, wherein the conductive material includes silver (Ag).

10. A method of manufacturing a wiring board, comprising the multilayer structure forming method according to claim 7.

11. A method of manufacturing an electronic apparatus, comprising the multilayer structure forming method according claim 7.

12. The multilayer structure forming method according to claim 7,
   the droplet discharge apparatus being an inkjet apparatus.

* * * * *